United States Patent
Lin et al.

(10) Patent No.: US 11,682,711 B2
(45) Date of Patent: Jun. 20, 2023

(54) SEMICONDUCTOR DEVICE HAVING MULTI-LAYERED GATE SPACERS

(71) Applicant: Taiwan Semiconductor Manufacturing Co., Ltd., Hsinchu (TW)

(72) Inventors: Wen-Kai Lin, Yilan County (TW); Che-Hao Chang, Hsinchu (TW); Chi On Chui, Hsinchu (TW); Yung-Cheng Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 215 days.

(21) Appl. No.: 17/145,925

(22) Filed: Jan. 11, 2021

(65) Prior Publication Data
US 2021/0376105 A1    Dec. 2, 2021

Related U.S. Application Data

(60) Provisional application No. 63/031,076, filed on May 28, 2020.

(51) Int. Cl.
*H01L 29/49* (2006.01)
*H01L 29/66* (2006.01)
(Continued)

(52) U.S. Cl.
CPC .. *H01L 29/4983* (2013.01); *H01L 21/823807* (2013.01); *H01L 21/823814* (2013.01); *H01L 21/823821* (2013.01); *H01L 21/823828* (2013.01); *H01L 21/823864* (2013.01); *H01L 21/823871* (2013.01); *H01L 27/0924* (2013.01); *H01L 29/0847* (2013.01);
(Continued)

(58) Field of Classification Search
CPC ............ H01L 29/6656; H01L 29/4983; H01L 21/823468; H01L 21/823864; H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067
See application file for complete search history.

(56) References Cited

U.S. PATENT DOCUMENTS 8,962,400 B2   2/2015   Tsai et al.
9,093,514 B2   7/2015   Tsai et al.
(Continued)

FOREIGN PATENT DOCUMENTS

JP   2012164869 A   8/2012
KR   20160059861 A   5/2016

*Primary Examiner* — Younes Boulghassoul
(74) *Attorney, Agent, or Firm* — Slater Matsil, LLP

(57) ABSTRACT

Semiconductor devices and methods of manufacture are presented in which spacers are manufactured on sidewalls of gates for semiconductor devices. In embodiments the spacers comprise a first seal, a second seal, and a contact etch stop layer, in which the first seal comprises a first shell along with a first bulk material, the second seal comprises a second shell along with a second bulk material, and the contact etch stop layer comprises a third bulk material and a second dielectric material.

20 Claims, 26 Drawing Sheets

(51) Int. Cl.
   *H01L 21/8238*   (2006.01)
   *H01L 29/08*     (2006.01)
   *H01L 29/417*    (2006.01)
   *H01L 29/78*     (2006.01)
   *H01L 27/092*    (2006.01)

(52) U.S. Cl.
   CPC .... *H01L 29/41791* (2013.01); *H01L 29/6656* (2013.01); *H01L 29/66492* (2013.01); *H01L 29/66545* (2013.01); *H01L 29/66795* (2013.01); *H01L 29/7833* (2013.01); *H01L 29/7848* (2013.01); *H01L 29/7851* (2013.01)

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2007/0246751 A1* | 10/2007 | Cheng | H01L 29/6656 257/288 |
| 2008/0146043 A1* | 6/2008 | Kohli | H01L 21/76224 438/795 |
| 2012/0199913 A1 | 8/2012 | Murata et al. | |
| 2013/0187202 A1* | 7/2013 | Rao | H01L 29/6653 257/288 |
| 2016/0141381 A1* | 5/2016 | Kim | H01L 29/785 257/288 |
| 2017/0125586 A1* | 5/2017 | Lee | H01L 29/785 |
| 2019/0103473 A1* | 4/2019 | Pan | H01L 29/6656 |
| 2019/0165125 A1* | 5/2019 | Lai | H01L 29/4983 |
| 2019/0348520 A1* | 11/2019 | Kuo | H01L 29/0847 |
| 2020/0105620 A1* | 4/2020 | Tan | H01L 21/02532 |

* cited by examiner

US 11,682,711 B2

SEMICONDUCTOR DEVICE HAVING MULTI-LAYERED GATE SPACERS

PRIORITY CLAIM AND CROSS-REFERENCE

This application claims the benefit of U.S. Provisional Application No. 63/031,076, filed on May 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
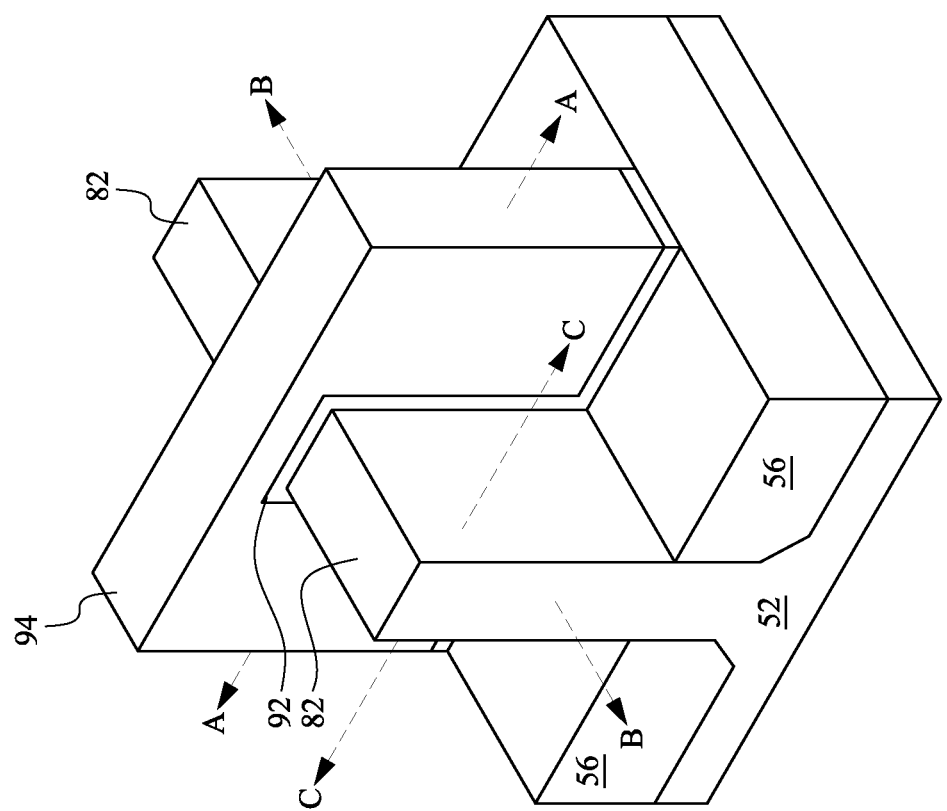
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be discussed with reference to particular embodiments as described below in which seal spacers are utilized to help reduce damage while also maintaining a suitable dielectric constant. However, the embodiments described are specific embodiments which are not intended to limit the ideas presented herein. Rather, the ideas can be utilized in a wide range of embodiments, and all such embodiments are fully intended to be included within the scope of the descriptions.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Epitaxial source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the epitaxial source/drain regions 82 of the FinFET. Cross-section B-B is perpendicular to cross-section A-A and is along a longitudinal axis of the fin 52 and in a direction of, for example, a current flow between the epitaxial source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 19B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A and 19A are illustrated along reference cross-section A-A illustrated in FIG. 1, and FIGS. 8B, 9B, 10B, 11B, 12B, 13B, 14B, 15B, 16B, 17B, 18B, and 19B are illustrated along a similar cross-section B-B illustrated in FIG. 1, except for multiple fins/FinFETs. FIGS. 8C, 8D, 9C, 9D, 10C, 10D, 11C, 11D, 12C, 12D, 13C, and 13D are illustrated along reference cross-section C-C illustrated in FIG. 1, except for multiple fins/FinFETs in different regions.

Figure 2:
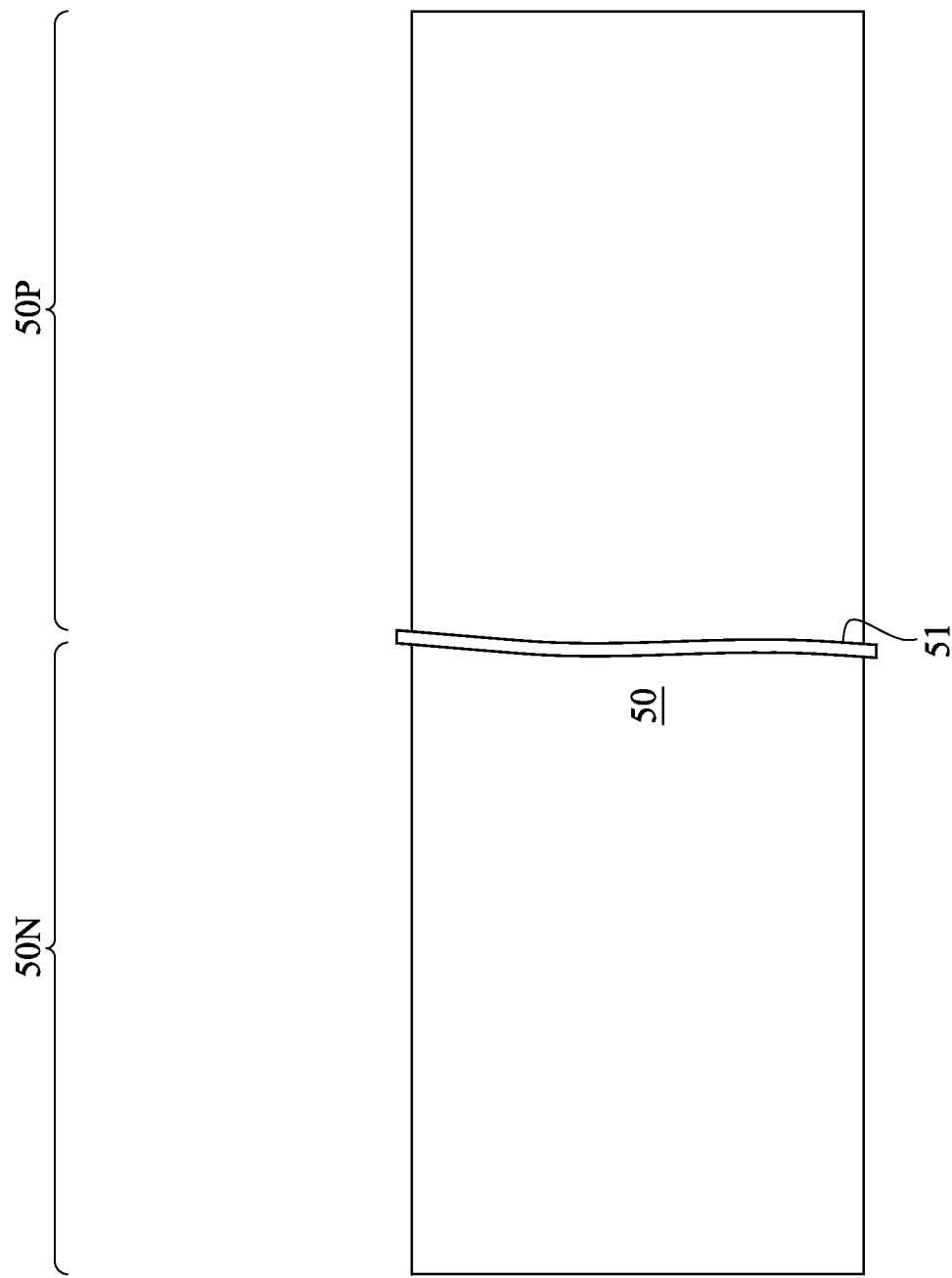
FIGS. 2, 3, 4, 5, 6, 7, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 15A, 15B, 16A, 16B, 17A, 17B, 17C, 18A, 18B, 19A, AND 19B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
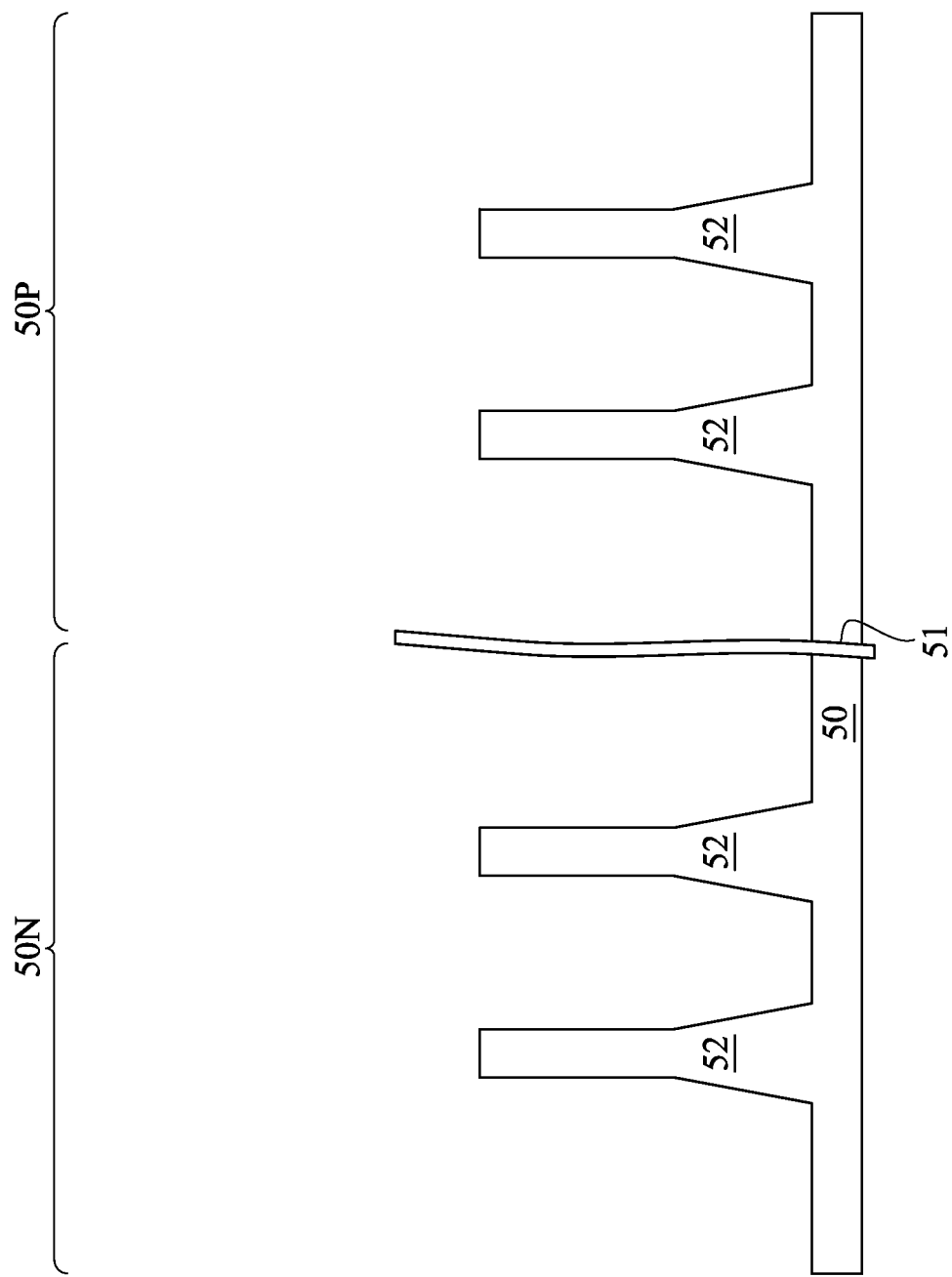

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
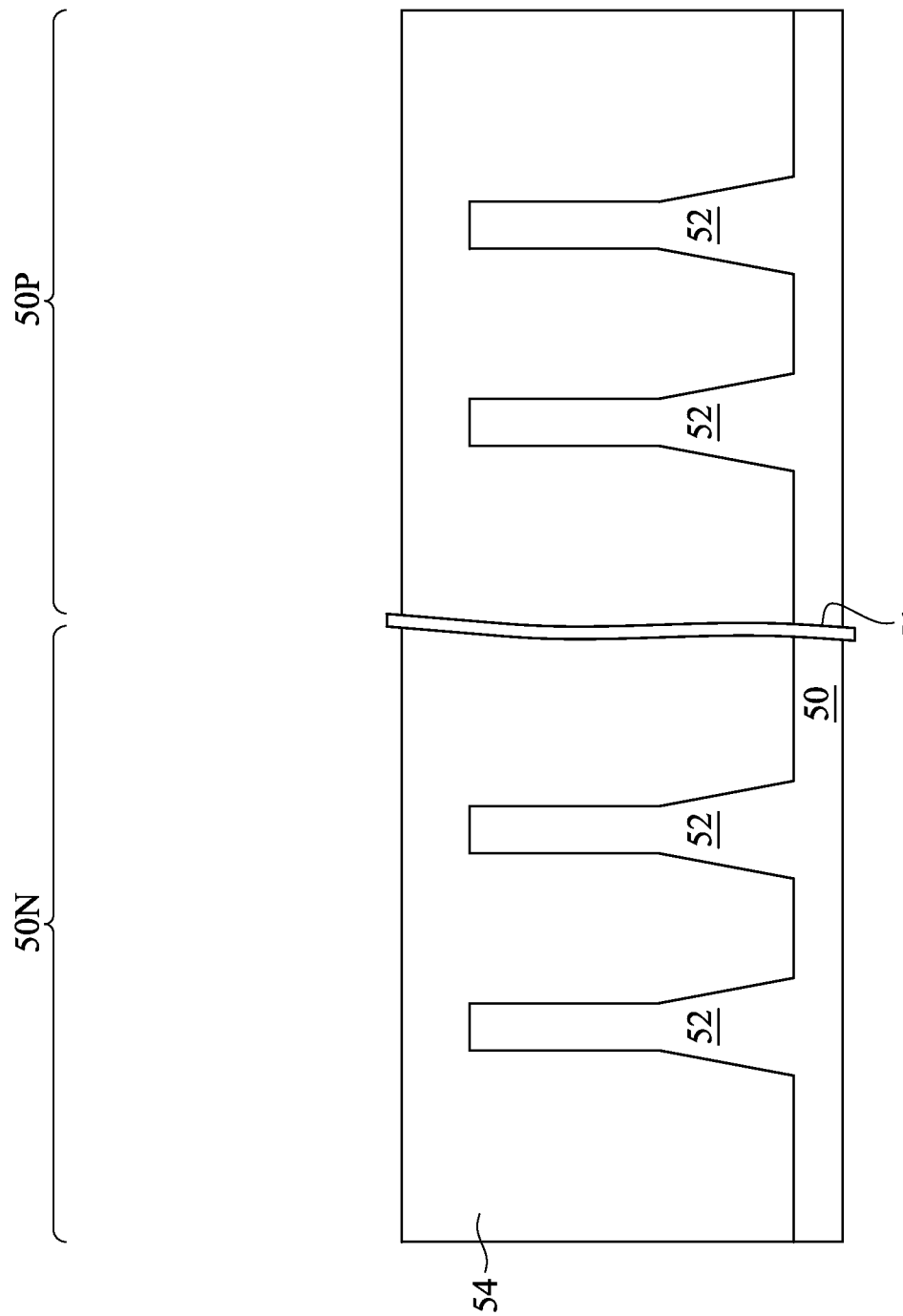

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
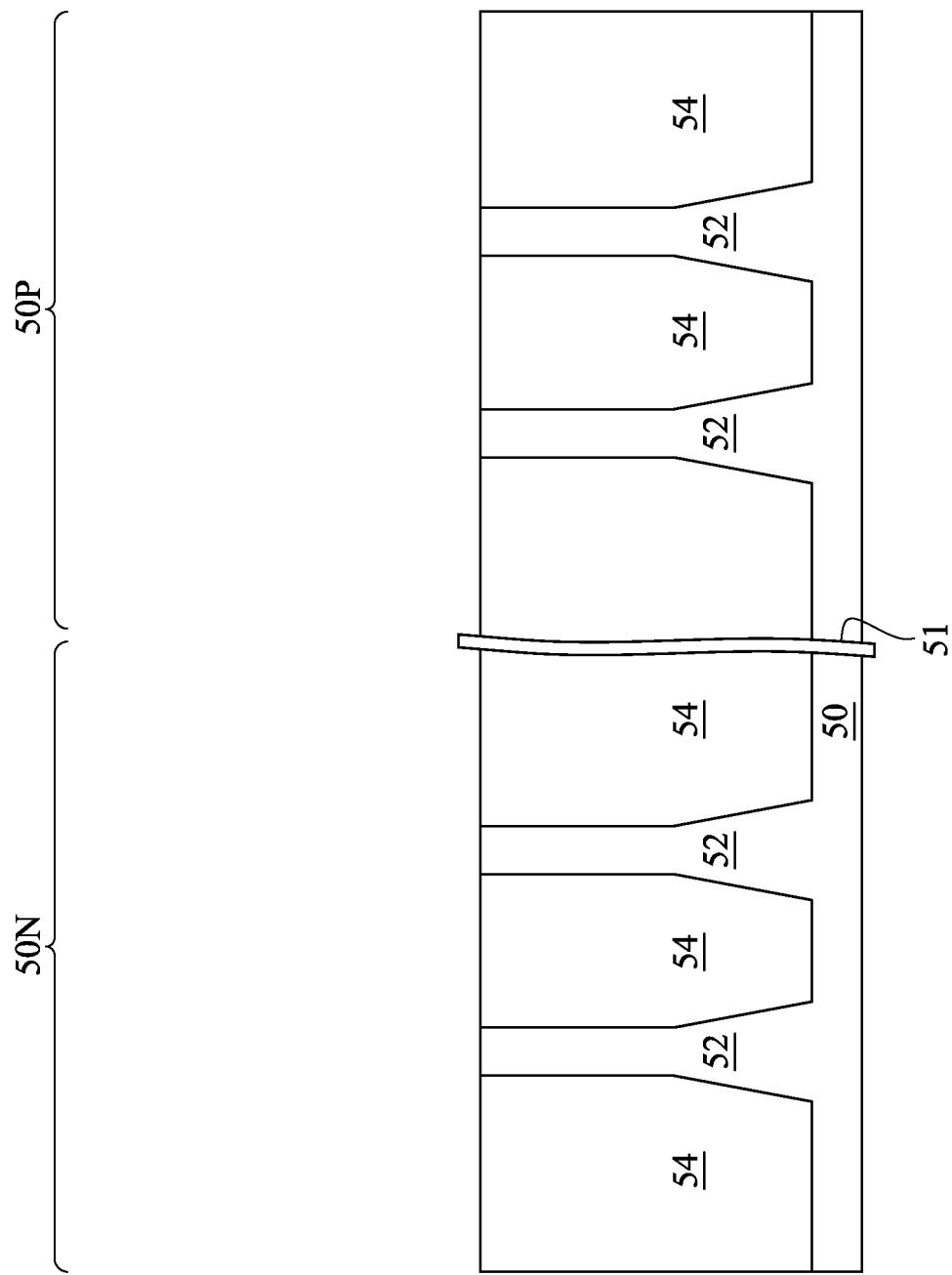

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
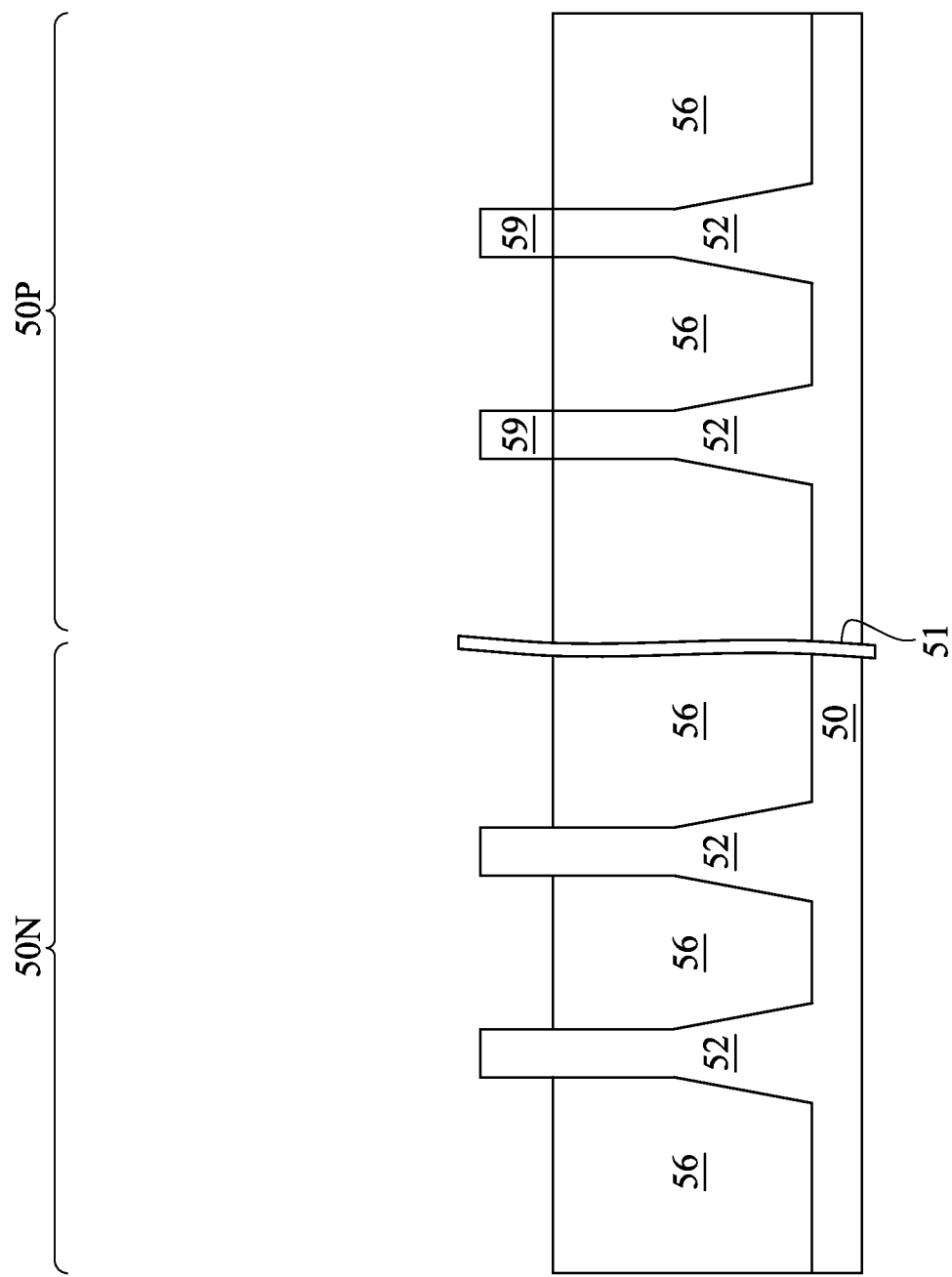

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some other embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, in some embodiments in which a heteroepitaxial structures is desired a second semiconductor material 59 may be epitaxially grown as part of the fins 52 in the p-type region 50P different from the material in the n-type region 50N. For example, upper portions of the fins 52 in the p-type region 50P may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like. However, any suitable material and any suitable process may be utilized.

Further with respect to FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
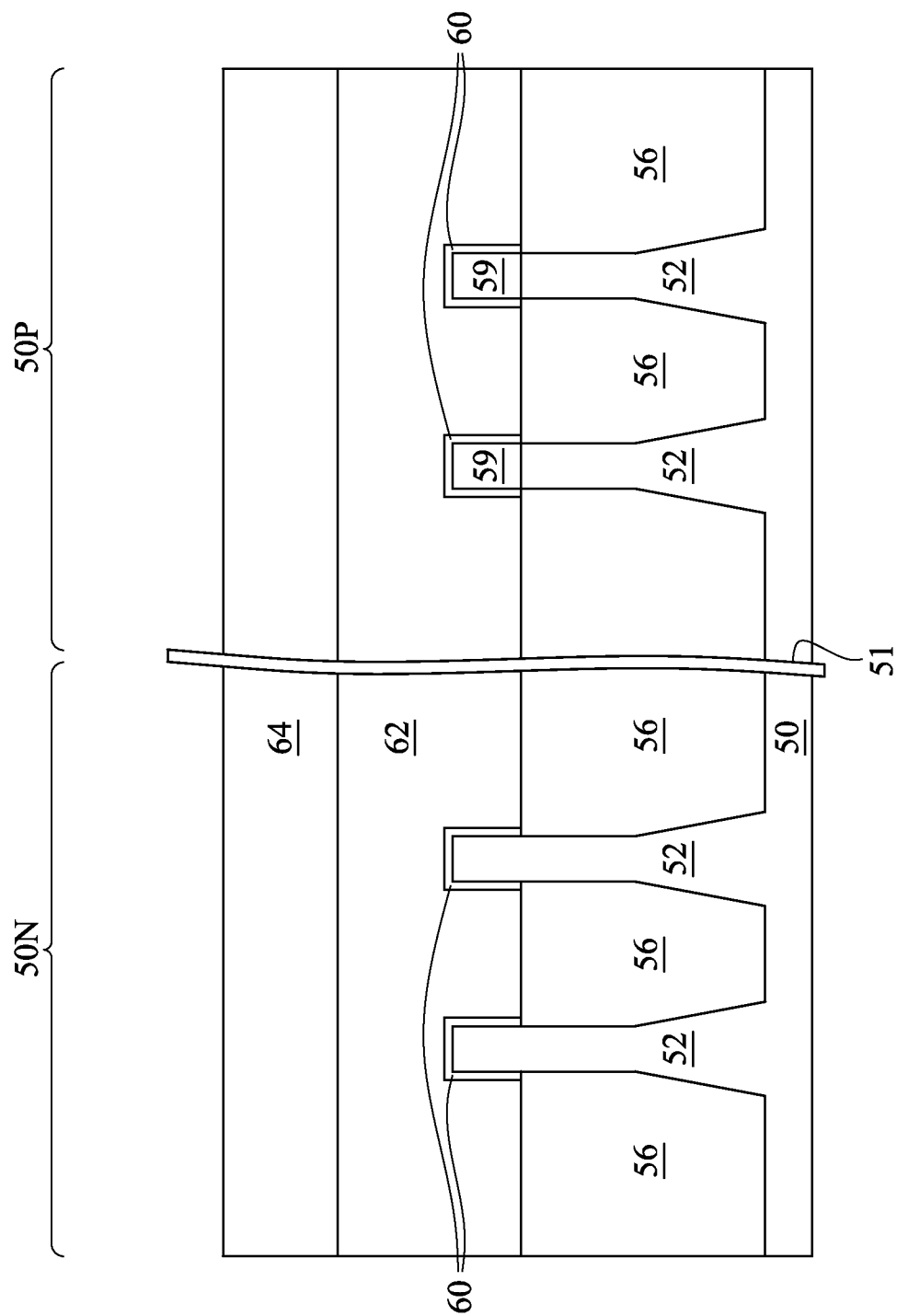

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

Figure 8B:
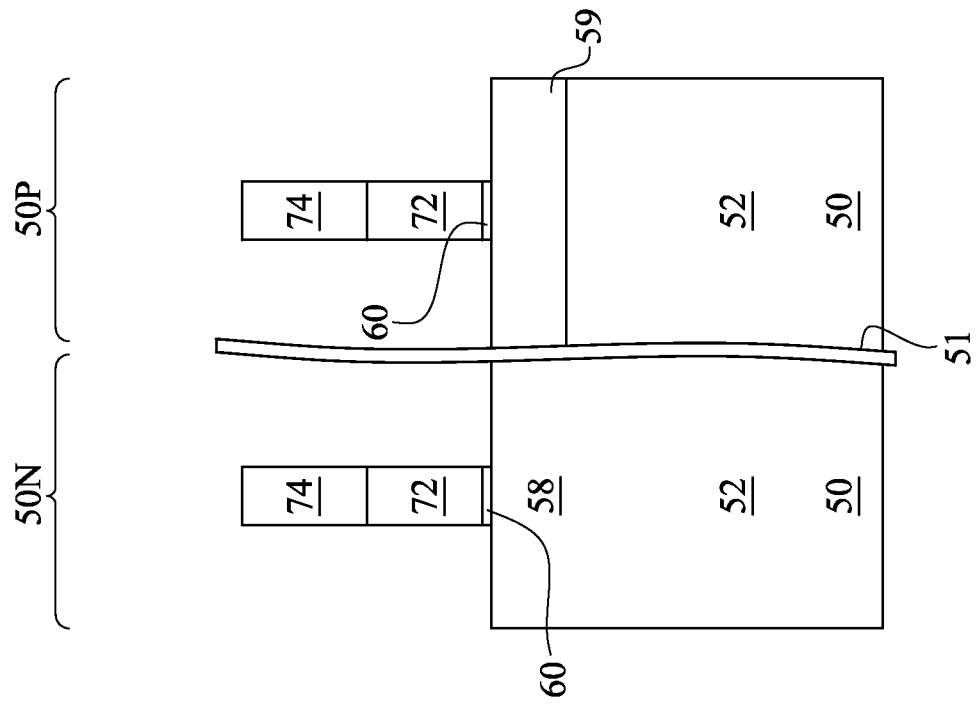
Figure 8A:
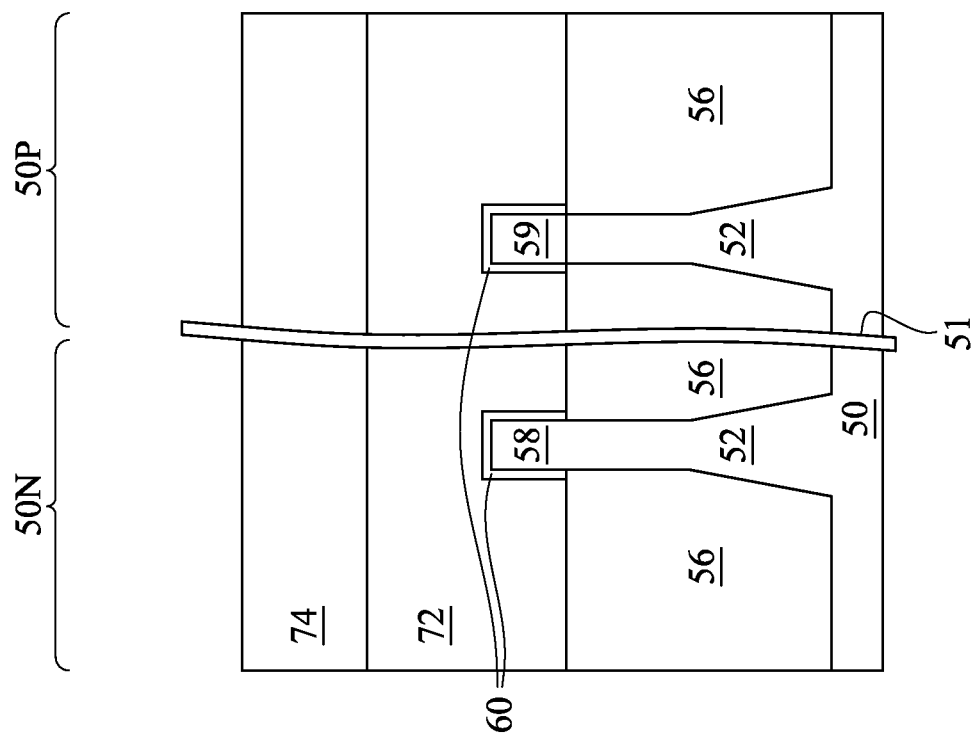

FIGS. 8A through 19B illustrate various additional steps in the manufacturing of embodiment devices, in which, for convenience, only a single fin 52 in the n-type region 50N and a single fin 52 within the p-type region 50P are illustrated. In FIGS. 8A and 8B, the mask layer 64 (see FIG. 7) may be patterned using acceptable photolithography and etching techniques to form masks 74. The pattern of the masks 74 then may be transferred to the dummy gate layer 62 to form dummy gates 72. In some embodiments (not illustrated), the pattern of the masks 74 may also be transferred to the dummy dielectric layer 60. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Figure 8D:
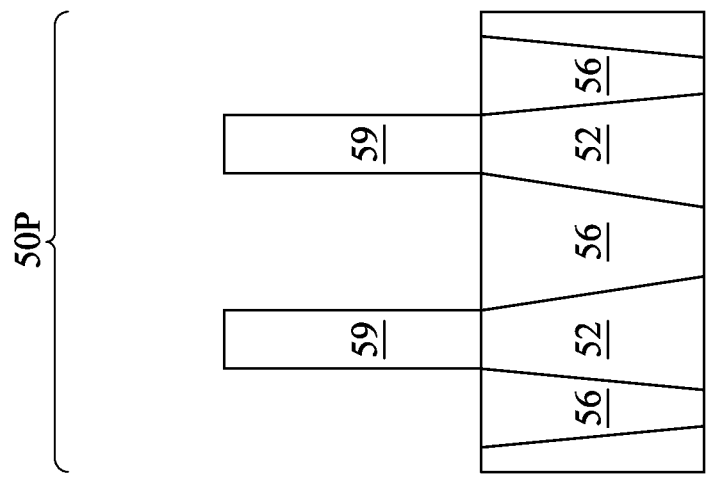
Figure 8C:
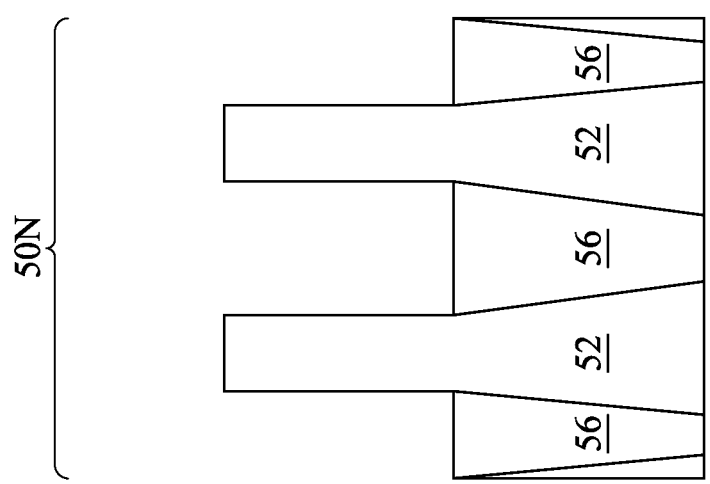
Figure 9B:
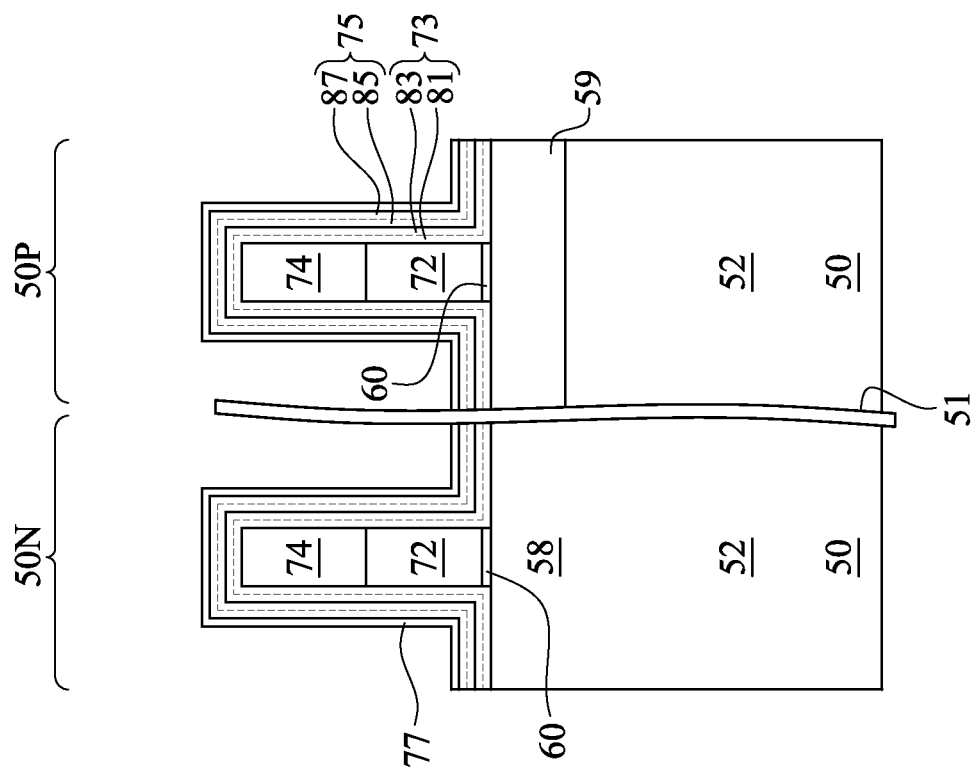
Figure 9A:
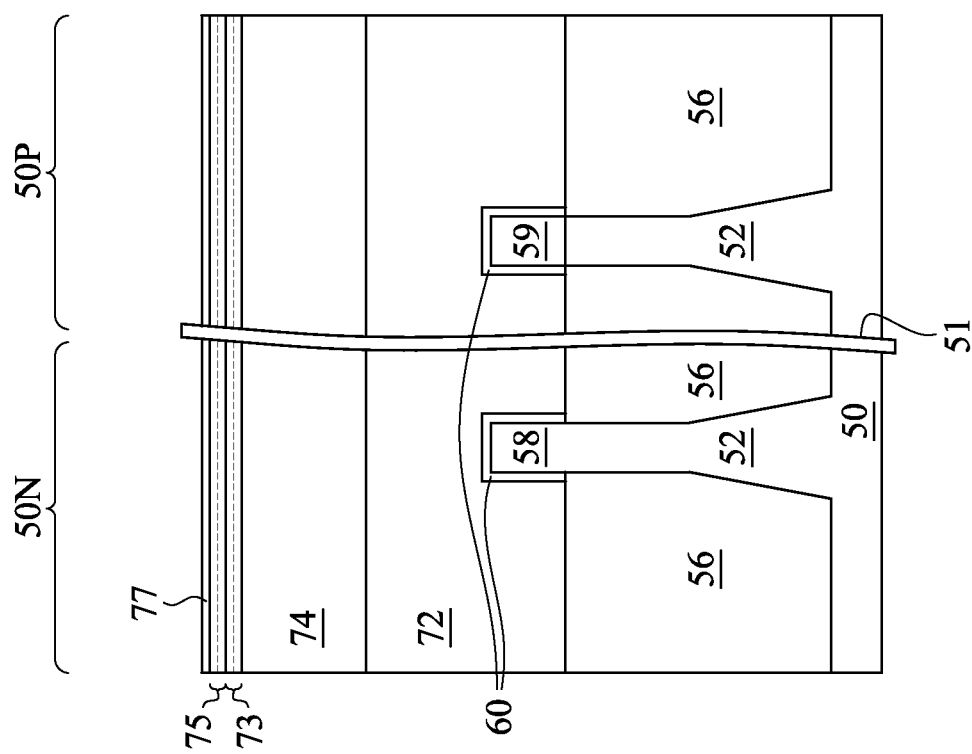
Figure 9D:
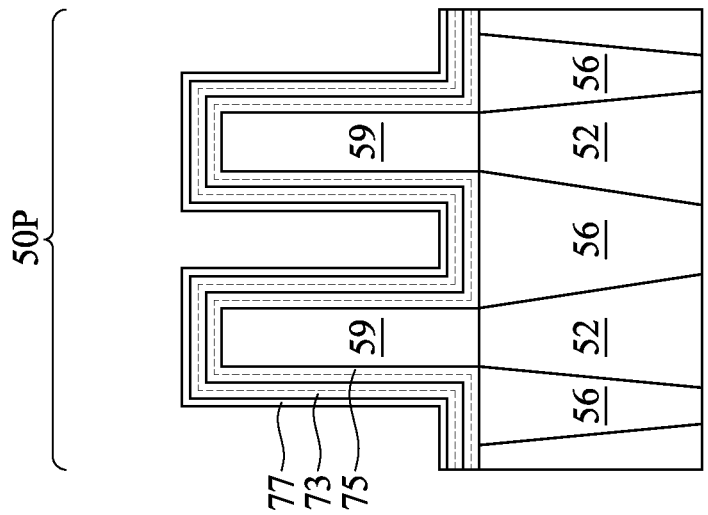
Figure 9C:
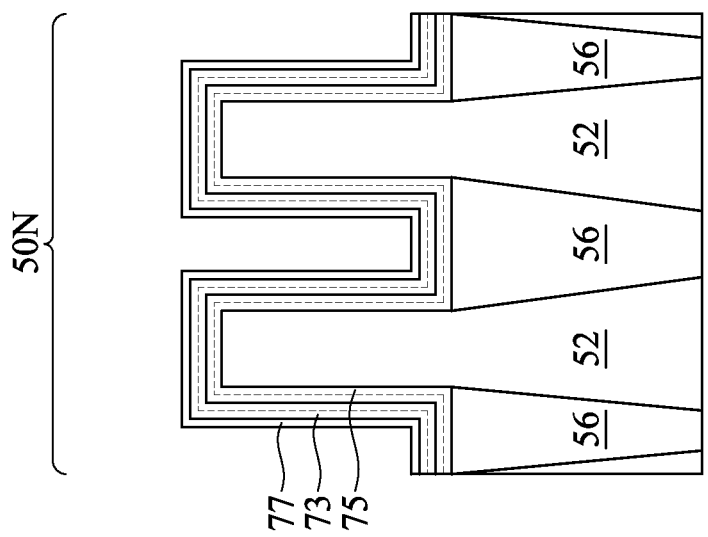
Figure 10B:
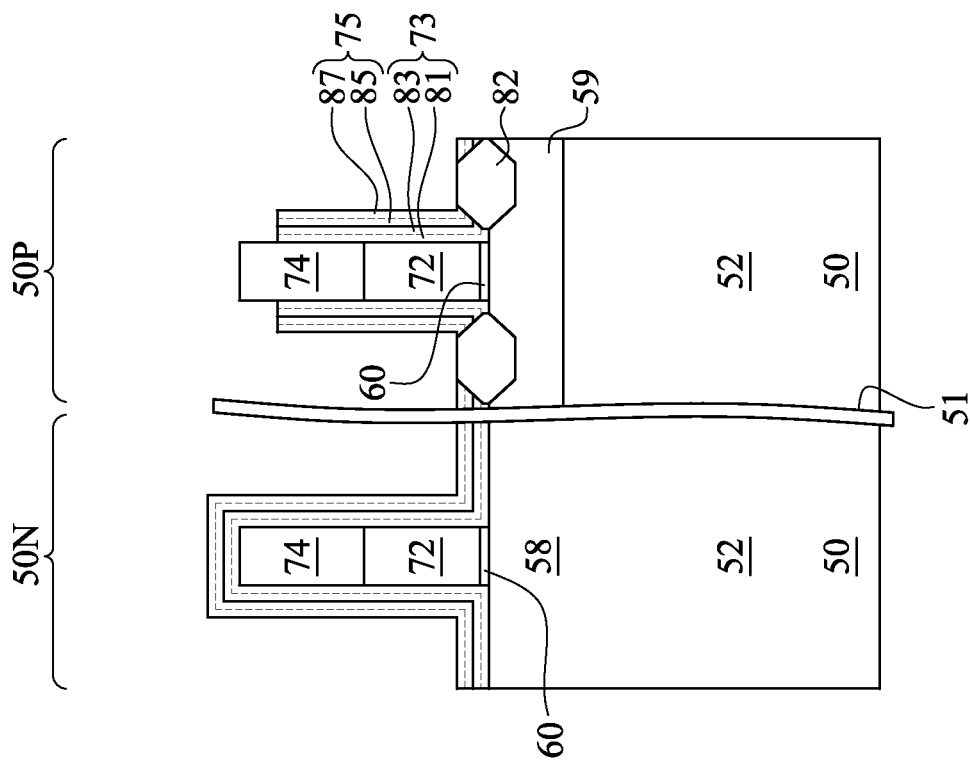
Figure 10A:
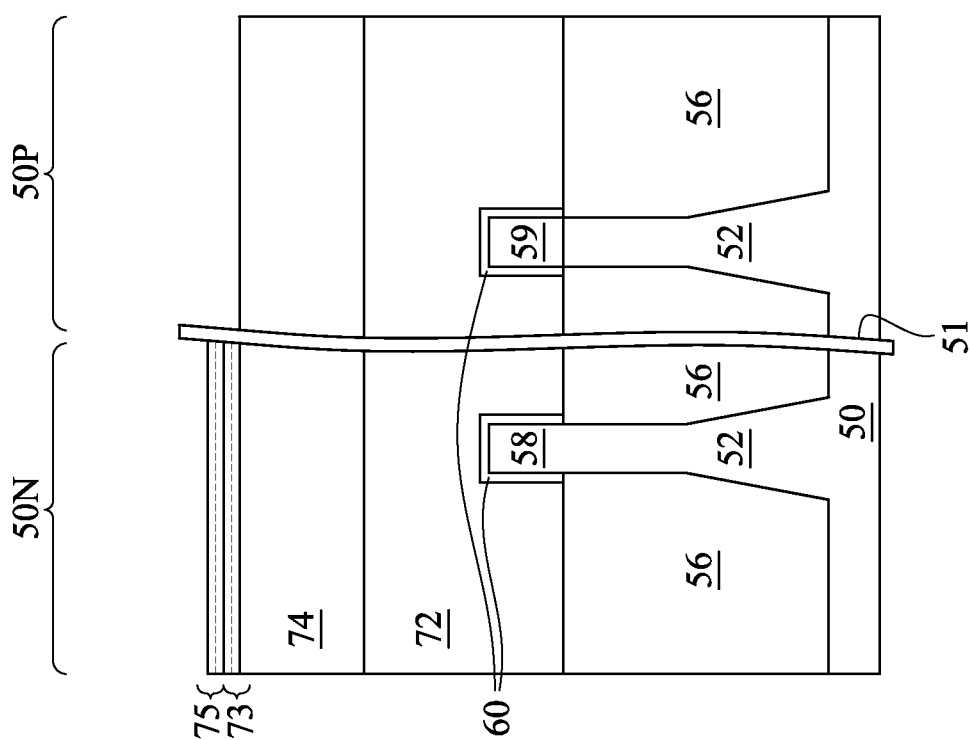
Figure 10D:
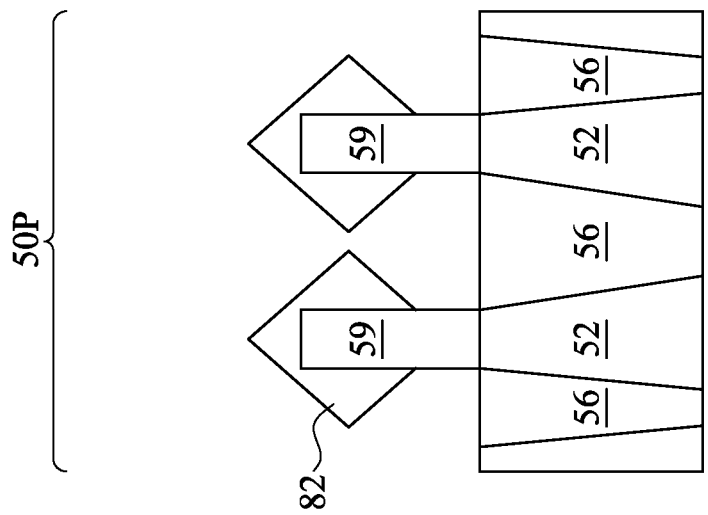
Figure 10C:
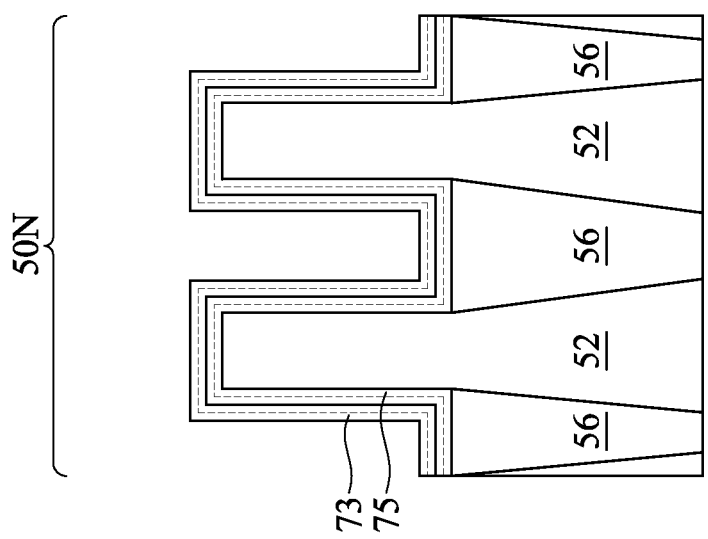
Figure 11B:
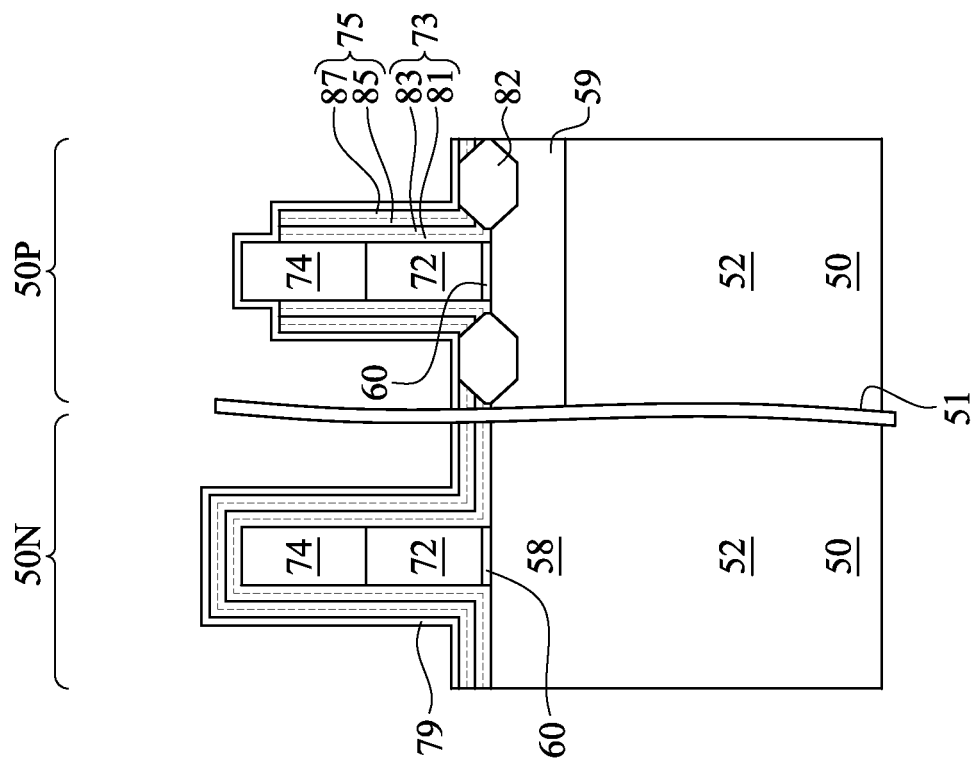
Figure 11A:
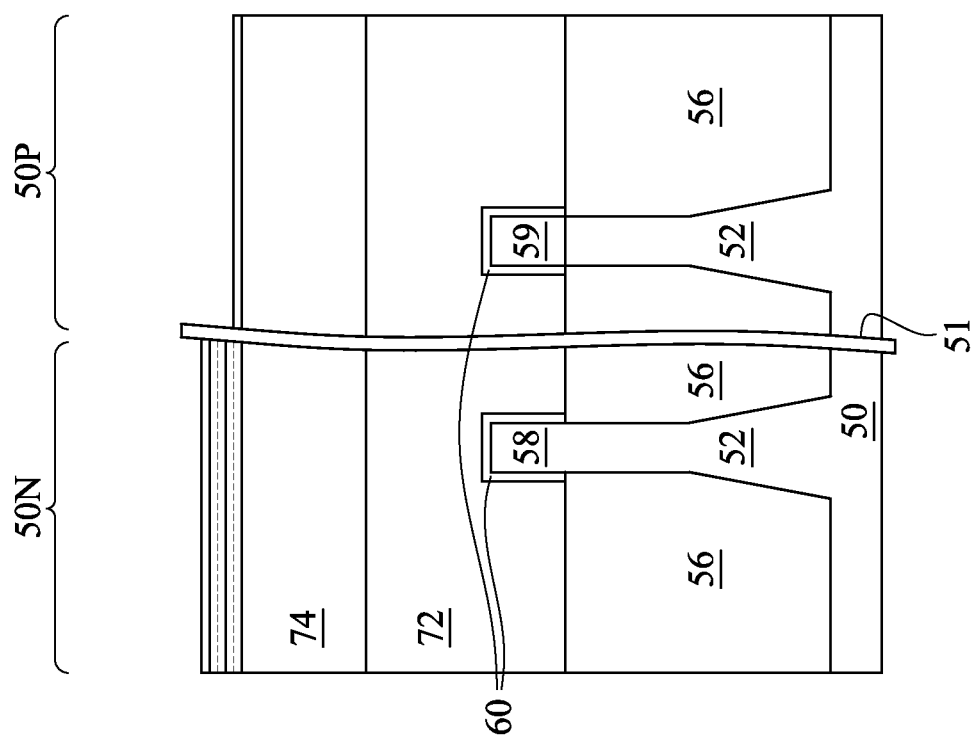
Figure 11D:
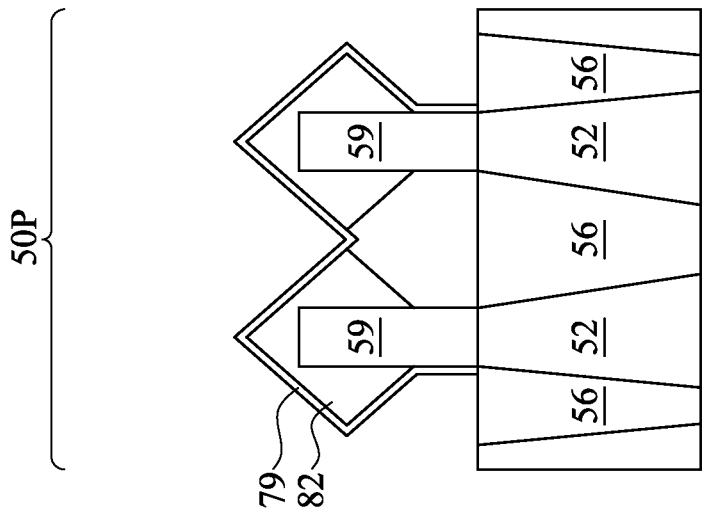
Figure 11C:
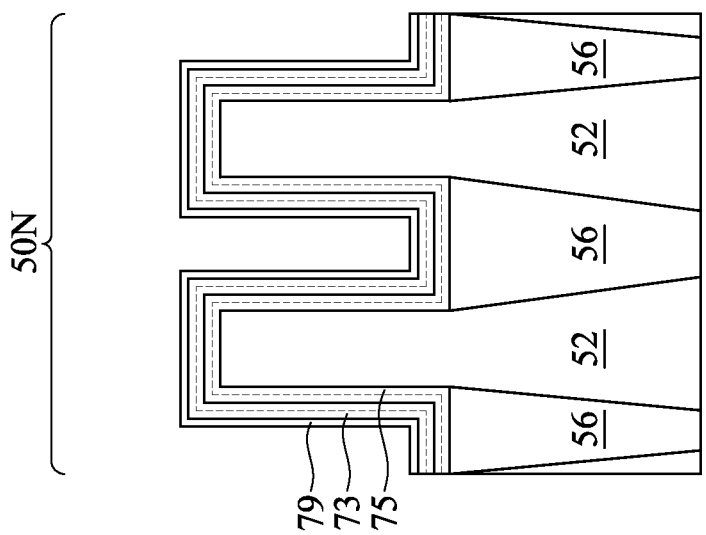
Figure 12B:
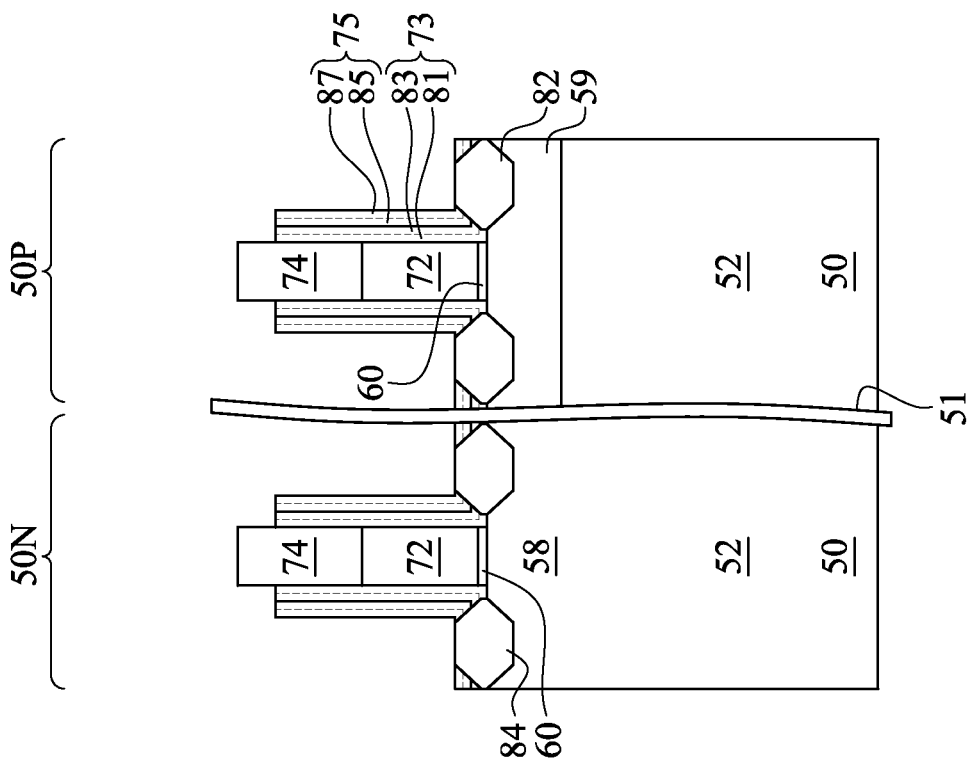
Figure 12A:
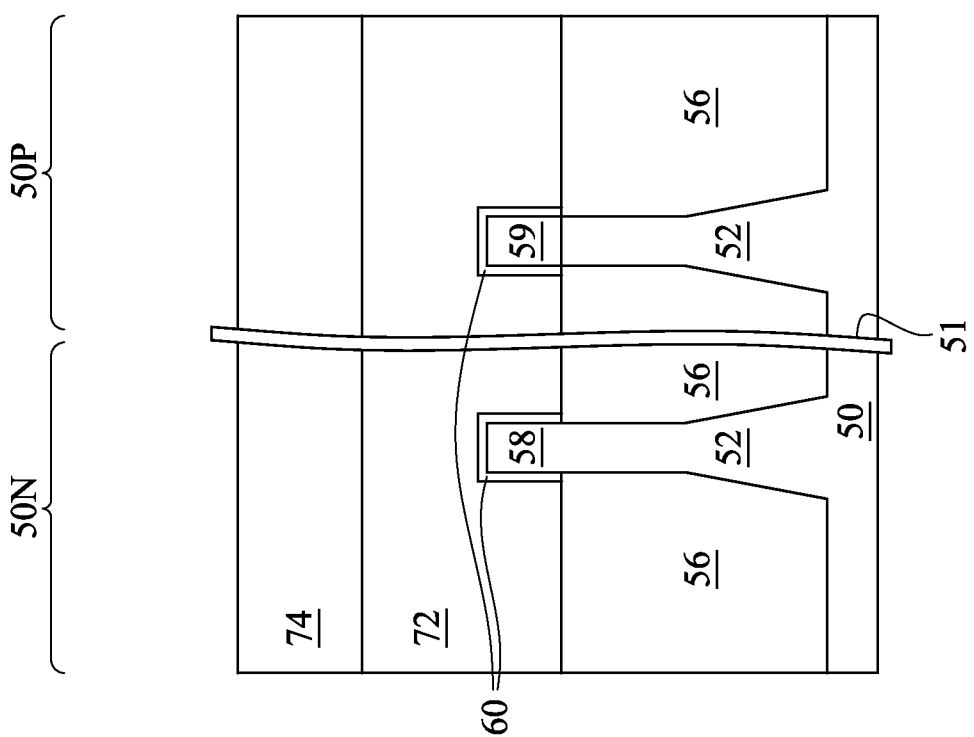
Figure 12D:
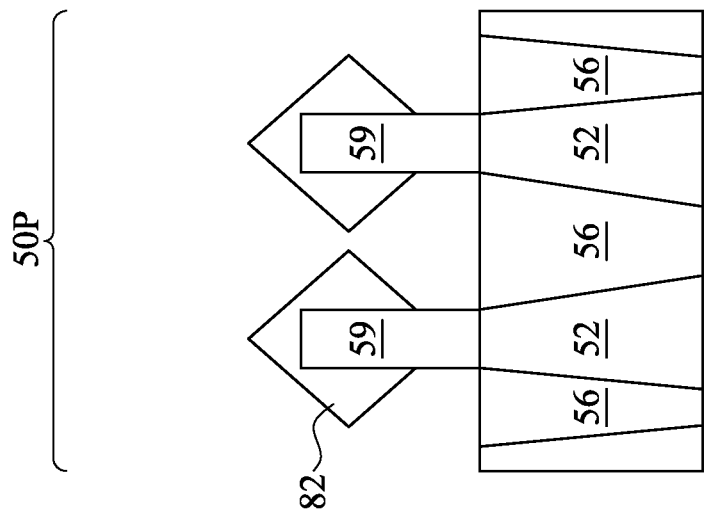
Figure 12C:
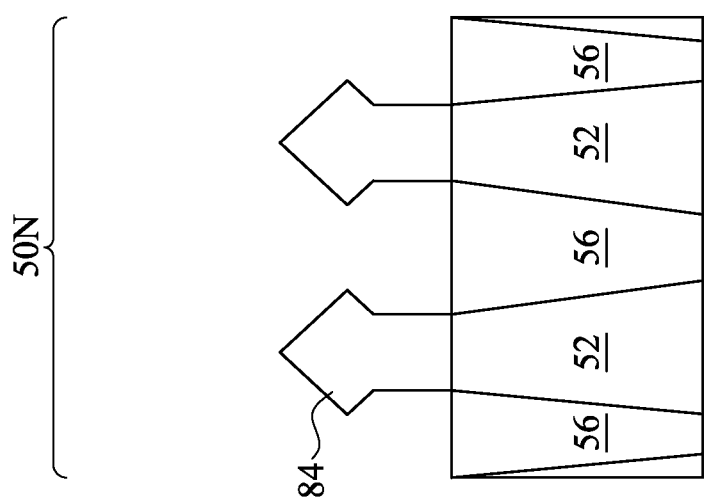

FIGS. 8C and 8D illustrate cross-sectional view of the fins 52 along line C-C (see FIG. 1), with FIG. 8C illustrating a view located within the n-type region 50N and FIG. 8D illustrating a view located within the p-type region 50P. As can be seen at this point in the manufacturing process, the top portion of the semiconductor material of the fins 52 in the p-type region 50P has been replaced with the second semiconductor material 59. Additionally, even after the patterning of the dummy gates 72 (see FIGS. 8A-8B), a portion of the masks 74 may still be located along sidewalls of the fins 52.

FIGS. 9A-9D illustrate that, once the dummy gates 72 have been patterned, a first seal 73 (or first spacer) may be deposited over the dummy gates 72. In an embodiment the first seal 73 may be a dielectric material such as SiCON which is manufactured to have both a first outer shell 81 adjacent to the dummy gates 72 to help the first seal 73 reduce etch losses and also have a first bulk dielectric material 83 adjacent to the first outer shell 81 in order to reduce the effective capacitance ($C_{eff}$) of the device in order to improve the overall performance of the device. However, any suitable number of layers in any configuration may be utilized.

In an embodiment the first outer shell 81 of the first seal 73 is deposited using a deposition process such as atomic layer deposition, although any suitable deposition process, such as chemical vapor deposition, physical vapor deposition, or the like may also be utilized. In such an embodiment using atomic layer deposition, a number of precursors are sequentially introduced to the structure (with suitable purges between the various precursors), which precursors will each react in a self-limiting reaction to cyclically build up individual layers of the desired material (e.g., SiCON) monolayer by monolayer.

In a very particular embodiment in which the first outer shell 81 is formed of SiCON using atomic layer deposition, a first precursor may be a silicon containing precursor such as hexachlorodisilane. In this embodiment the hexachlorodisilane may be introduced to the structure, where the hexachlorodisilane will react with exposed sites on the surface of the structure in a self-limiting reaction. In such an embodiment the hexachlorodisilane may be introduced to the structures at a flow rate of between about 0.2 slm and about 1.0 slm for a time of about 20 seconds(+/−15 seconds). Additionally, the temperature during the reaction may be kept at a temperature of between about 500° C. and about 680° C. However, any suitable process parameters may be utilized.

A second precursor may be a carbon containing precursor such as propane, and the second precursor may be introduced to the structure after the introduction of the first precursor. Upon introduction, the second precursor (e.g., propane) will react with the product of the hexachlorodisilane reaction in another self-limiting reaction. In such an embodiment the propane may be introduced at a flow rate of between about 0.5 slm and about 5.0 slm for a time of about 90 seconds(+/−30 seconds). Additionally, the temperature during the reaction may be kept at a temperature of between about 500° C. and about 680° C. However, any suitable process parameters may be utilized.

A third precursor may be an oxygen containing precursor such as oxygen ($O_2$), and the third precursor may be introduced to the structure after the introduction of the second precursor. Upon introduction to the structure, the third precursor (e.g., oxygen) will react with the product of the previous reaction in another self-limiting reaction. In such an embodiment the oxygen may be introduced at a flow rate of between about 1 slm and about 5 slm for a time of about 15 seconds(+/−10 seconds). Additionally, the temperature during the reaction may be kept at a temperature of between about 500° C. and about 680° C. However, any suitable process parameters may be utilized.

A fourth precursor may be a nitrogen containing precursor such as ammonia, and the fourth precursor may be introduced to the structure after the introduction of the third precursor. Upon introduction to the structure, the fourth precursor (e.g., ammonia) will react with the product of the previous reaction in another self-limiting reaction. In such an embodiment the ammonia may be introduced at a flow rate of between about 0.5 slm and about 5.0 slm for a time of about 30 seconds (+/−15 seconds). Additionally, the temperature during the reaction may be kept at a temperature of between about 500° C. and about 680° C. However, any suitable process parameters may be utilized.

Once the fourth precursor has been introduced a first time, a first cycle of the atomic layer deposition process has been completed, and a second cycle may be started in order to build up a second monolayer of the desired material. The cycles may be repeated as often as desired in order to form the first outer shell 81 to a desired thickness, such as between about 0.2 nm and about 1 nm. However, any suitable thickness may be utilized.

By forming the first outer shell 81 of the first seal 73 as described, the first outer shell may be formed to be more resistant to damage from subsequent etching process (described further below). For example, the first outer shell 81 may be formed in the final product to have a density of between about 2.5 $g/cm^3$ and about 2.7 $g/cm^3$ and with a dielectric constant of between about 5.1 and about 5.5. Additionally, with the process conditions as described above, the first outer shell 81 of the first seal 73 may be formed to be carbon-rich and nitrogen-rich, with a carbon concentration of between about 5%-atomic and about 20%-atomic (e.g., 12%-atomic) and a nitrogen concentration of between about 24%-atomic and about 45%-atomic (e.g., 25%-atomic). Additionally, the first outer shell 81 may have an oxygen concentration of between about 24%-atomic and about 40%-atomic (e.g., 32%-atomic) and a silicon concentration of between about 27%-atomic and about 37%-atomic (e.g., 32%-atomic). However, any suitable characteristics may be utilized.

Once the first outer shell 81 of the first seal 73 has been formed, the first bulk dielectric material 83 may be deposited in-situ with the first outer shell 81. In an embodiment the first bulk dielectric material 83 may be a material similar to the first outer shell 81, such as by being the same material with a different composition. For example, in an embodiment in which the first outer shell 81 of the first seal 73 is SiCON, the first bulk dielectric material 83 may also be SiCON, although with a different composition in order to help lower the dielectric constant of the first seal 73.

In an embodiment the first bulk dielectric material 83 may be deposited using a similar process as the first outer shell 81, such as atomic layer deposition with similar precursors, such as the first precursor (e.g., hexachlorodisilane), the second precursor (e.g., propane), the third precursor (e.g., oxygen), and the fourth precursor (e.g., ammonia). However, in order to have a different composition, the amount of time which each precursor is allowed to contact the structures is modified such that the first set of exposures times is different from the new set of exposures times. Additionally, in other embodiments, the sequence of precursors can be changed as well.

In one particular example to form the first bulk dielectric material 83, the first precursor may be introduced at a flow rate of between about 0.2 slm and about 1.0 slm for a time of about 20 seconds(+/−8 seconds), while the second precursor may be introduced at a flow rate of between about 0.5 slm and about 5.0 slm for a time of about 90 seconds(+/−30 seconds). Additionally, the fourth precursor (e.g., nitrogen) may be introduced prior to the introduction of the third precursor (e.g., oxygen) at a flow rate of between about 0.5 slm and about 5.0 slm for a time of about 9 seconds(+/−5 seconds). Finally, the third precursor (e.g., oxygen) may be introduced after the fourth precursor (e.g., nitrogen) at a flow rate of between about 0.5 slm and about 5.0 slm for a time of about 18 seconds(+/−10 seconds). However, any suitable flow rates and times may be utilized.

Once the third precursor has been introduced a first time, a first cycle of the atomic layer deposition process has been completed, and a second cycle may be started in order to build up a second monolayer of the desired material. The cycles may be repeated as often as desired in order to form the first bulk dielectric material 83 to a desired thickness, such as between about 3 nm and about 5 nm. However, any suitable thickness may be utilized.

By utilizing these parameters, the first bulk dielectric material 83 may be formed with characteristics that are more suitable to lowering the dielectric constant while not being as resistance to etching processes as the first outer shell 81. For example, the first bulk dielectric material 83 may be formed in the final product to have a dielectric constant of less than about 5.0. Additionally, the first bulk dielectric material 83 may be formed to a density of between about 2.0 g/cm$^3$ and about 2.4 g/cm$^3$ and may be an oxygen-rich film, with an oxygen concentration of between about 40%-atomic and about 65%-atomic (e.g., 53% -atomic, greater than the oxygen content of the first outer shell 81). Finally, the first bulk dielectric material 83 may have a carbon concentration of less than about 2%-atomic (e.g., 1%-atomic, less than the carbon content of the first outer shell 81), a nitrogen concentration of between about 5%-atomic and about 14%-atomic (e.g., 12%-atomic), and a silicon concentration of between about 24%-atomic and about 40%-atomic (e.g., 32%-atomic). However, any suitable characteristics may be utilized.

By depositing the first outer shell 81 and the first bulk dielectric material 83, the first seal 73 can be deposited with materials which allow the first seal 73 to have both an etch resistant portion (e.g., the first outer shell 81) and also have a dielectric reducing portion (e.g., the first bulk dielectric material 83). Additionally, the first seal 73 can have a gradient region where the two layers partially diffuse into each other of between about 0.5 nm and about 1 nm. Such an arrangement allows the overall first seal 73 to have both the desired resistance to etching damage without fully sacrificing the lower dielectric constant, leading to fewer defects that can occur during the manufacturing process.

After the formation of the first seal 73, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

After the LDD regions have been formed, a second seal 75 is formed over the first seal 73. In an embodiment the second seal 75 may be formed of a similar material and using similar processes as the first seal 73. For example, the second seal 75 may be formed of SiCON, and may also comprise a second bulk dielectric material 85 and a second outer shell 87. However, any suitable materials may be utilized.

In an embodiment the second bulk dielectric material 85 may be deposited in situ as described above with respect to the first bulk dielectric material 83 in order to obtain similar physical characteristics. However, the second bulk dielectric material 85 is deposited prior to the deposition of the second outer shell 87, such that the second bulk dielectric material 85 is in physical contact with the first bulk dielectric material 83.

For example, in some embodiments the second bulk dielectric material 85 may be formed in the final product to a thickness of between about 3 nm and about 5 nm. Additionally, the second bulk dielectric material 85 may be formed to a density of between about 2.0 g/cm$^3$ and about 2.4 g/cm$^3$ and may be an oxygen-rich film, with an oxygen concentration of between about 40% and about 65%. Finally, the second bulk dielectric material 85 may have a carbon concentration of less than about 2% and a nitrogen concentration of between about 5% and about 12%. However, any suitable composition may be utilized.

Once the second bulk dielectric material 85 has been formed in physical contact with the first bulk dielectric material 83, the second outer shell 87 may be deposited in order to protect the second bulk dielectric material 85 from damage during subsequent etching processes. In an embodiment the second outer shell 87 may be deposited as described above with respect to the deposition of the first outer shell 81.

For example, in an embodiment the second outer shell 87 may be formed to be resistant to etch damage. In one particular embodiment, the second outer shell 87 may be formed in the final product to a thickness of between about 0.2 nm and about 1 nm, and may be formed to have a density of between about 2.5 g/cm$^3$ and about 2.7 g/cm$^3$. Additionally, with the process conditions as described above, the second outer shell 87 may be formed to be carbon-rich and nitrogen-rich, with a carbon concentration of between about 5%-atomic and about 20%-atomic (e.g., 12%-atomic) and a nitrogen concentration of between about 24% -atomic and about 45%-atomic (e.g., 25%-atomic). Additionally, the second seal 75 can have a gradient region between the second outer shell 87 and the second bulk dielectric material 85 where the two layers partially diffuse into each other of between about 0.5 nm and about 1 nm. However, any suitable concentration may be utilized.

By depositing the second outer shell 87 and the second bulk dielectric material 85, the second seal 75 can be deposited with materials which allow the second seal 75 to have both an etch resistant portion (e.g., the second outer shell 87) and also have a dielectric reducing portion (e.g., the second bulk dielectric material 85). Such a distribution of characteristics allows for an increase in the overall ability to resist subsequent etches while also keeping the dielectric constant low.

Additionally, while a particular embodiment is described above in which the first seal 73 is formed, the LDD regions are formed, and then the second seal 75 is formed after formation of the LDD regions, this is intended to be illustrative and is not intended to be limiting. For example, in other embodiments the first seal 73 and the second seal 75 are formed in situ and back to back, and only after the second seal 75 has been formed are the LDD regions formed. Any suitable combinations of steps may be utilized, and all such embodiments are fully intended to be included within the scope of the embodiments.

FIGS. 9A-9D also illustrate that, once the second seal 75 has been deposited, a mask layer 77 is deposited over the structure. In an embodiment the mask layer 77 may be a dielectric layer such as silicon nitride, aluminum oxide, deposited using a deposition process such as atomic layer deposition, chemical vapor deposition, sputtering, combinations of these, or the like. However, any suitable material and method of manufacture may be utilized.

In Figures 10A-10D epitaxial source/drain regions 82 are formed in the fins 52 of the p-type FinFETs. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the first seal 73 and the second seals 75 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the p-type region 50P may be formed by masking the n-type region 50N and the dummy gates 72 within the p-type region 50P and etching to expose the underlying fin 52 (e.g., the second semiconductor material 59). Then, the epitaxial source/drain regions 82 in the p-type region 50P are epitaxially grown on the fins 52. The epitaxial source/drain regions 82 may include any acceptable material, such as appropriate for p-type FinFETs. For example, if the fin 52 is silicon germanium, the epitaxial source/drain regions 82 in the p-type region 50P may comprise materials exerting a strain in the channel region 58, such as silicon, boron doped silicongermanium, silicon-germanium, germanium tin, or the like. The epitaxial source/drain regions 82 in the p-type region 50P may have surfaces raised from respective surfaces of the fins 52 and may have facets.

Once the epitaxial source/drain regions 82 have been formed, any remaining portion of the mask layer 77 may be removed (with, e.g., an etchant such as $H_3PO_4$). In an embodiment the remaining portion of the mask layer 77 may be removed using, for example, one or more etching process, such as a wet etching process. However, any suitable method may be utilized. In some embodiments the multiple etching processes (e.g., the etching to remove the fins 52 and/or the etching to remove the mask layer 77) may further remove portions of the first seal 73 and the second seal 75 to a point that is lower than the masks 74.

FIGS. 11A-11D illustrate that, once the epitaxial source/drain regions 82 have been formed in the p-type region 50P, a second mask layer 79 is formed in order to begin forming the epitaxial source/drain regions 84 in the n-type region 50N. In an embodiment the second mask layer 79 may be formed using similar processes and similar materials as the mask layer 77. However, any suitable methods and materials may be utilized.

FIGS. 12A-12D illustrate that, once the second mask layer 79 is formed, the fins 52 in the n-type region 50N are exposed, and the epitaxial source/drain regions 84 in the n-type region 50N are epitaxially grown on the fins 52. The epitaxial source/drain regions 84 may include any acceptable material, such as appropriate for n-type FinFETs. For example, if the fin 52 is silicon, the epitaxial source/drain regions 84 in the n-type region 50N may include materials exerting a tensile strain in the channel region 58, such as silicon, silicon carbide, phosphorous doped silicon carbide, silicon phosphide, or the like. The epitaxial source/drain regions 84 in the n-type region 50N may have surfaces raised from respective surfaces of the fins 52 and may have facets.

Once the epitaxial source/drain regions 84 have been formed, any remaining portion of the second mask layer 79 may be removed. In an embodiment the remaining portion of the second mask layer 79 may be removed using, for example, one or more etching process, such as a wet etching process. However, any suitable method may be utilized. In some embodiments the multiple etching processes (e.g., the etching to remove the fins 52, the etching to remove the mask layer 77) may further remove portions of the first seal 73 and the second seal 75 to a point that is lower than the masks 74.

Additionally, while a particular embodiment was described above in which the epitaxial source/drain regions 84 and the epitaxial source/drain regions 82 are formed on the fins 52, this is intended to be illustrative and is not intended to be limiting. Rather, any suitable process may be utilized, such as exposing the fins 52, recessing the fins 52, and then regrowing the epitaxial source/drain regions 84 and the epitaxial source/drain regions 82 in the recess. All such processes are fully intended to be included within the embodiments.

The epitaxial source/drain regions 84 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 84 may be in situ doped during growth.

As a result of the epitaxy processes used to form the epitaxial source/drain regions 82 in the p-type region 50P and the epitaxial source/drain regions 84 in the n-type region 50N, upper surfaces of the epitaxial source/drain regions have facets which expand laterally outward beyond sidewalls of the fins 52. In some embodiments, these facets may cause adjacent source/drain regions of a same FinFET to merge. In other embodiments, adjacent source/drain regions remain separated after the epitaxy process is completed.

During all of the etching processes that are used to expose and/or recess the fins 52 in order to form the LDD regions as well as the epitaxial source/drain regions 82 and the epitaxial source/drain regions 84, the shells of the first seal 73 and the second seal 75 work to protect the inner portions of the first seal 73 and the second seal 75 (at least those portions which will remain in the final product). For example, while etchants such as sulfuric acid, ($H_2SO_4$), peroxide ($H_2O_2$), dilute hydrofluoric acid (dHF), and oxygen plasma may be used to etch, ash, or otherwise remove portions of the structure, the first outer shell 81 and the second outer shell 87 will work to sandwich and protect the first bulk dielectric material 83 and the second bulk dielectric material 85 from these etchants. Additionally, however, while the second outer shell 87 works to protect the inner materials during the etching process, a portion of the second outer shell 87 may itself be etched and/or damaged during the etching processes.

As such, FIGS. 13A-13D illustrate a process whereby the outer layers of the second seal 75 may be replenished using a contact etch stop layer (CESL) 97. In this embodiment, once the epitaxial source/drain regions 82 and the epitaxial source/drain regions 84 have been formed and an optional pre-clean using dilute hydrofluoric acid (at, e.g., 1:100 for 60 seconds) has been performed, the contact etch stop layer (CESL) 97 is deposited over the structure and in physical contact with the second outer shell 87 of the second seals 75. In an embodiment the CESL 97 may be similar to the first seal 73 and the second seal 75, such as by having a third bulk dielectric material 91 deposited adjacent to the second seals 75, and a third outer shell 93 adjacent to the third bulk dielectric material 91.

In an embodiment the third bulk dielectric material 91 may be formed as described above with respect to the first bulk dielectric material 83 and the second bulk dielectric material 85 in order to obtain similar physical characteristics. For example, the third bulk dielectric material 91 may be formed in the final product to a thickness of between about 1.0 nm and about 3.5 nm. Additionally, the third bulk dielectric material 91 may be formed to a density of between about 2.0 g/cm$^3$ and about 2.4 g/cm$^3$ and may be an oxygen-rich film, with an oxygen concentration of between about 40%-atomic and about 65%-atomic. Finally, the third bulk dielectric material 91 may have a carbon concentration of less than 2%-atomic and a nitrogen concentration of between about 5%-atomic and about 12%-atomic. However, any suitable composition may be utilized.

Once the third bulk dielectric material 91 has been formed, the third outer shell 93 may be deposited over the third bulk dielectric material 91. In an embodiment the third outer shell 93 may be deposited as a dielectric material that can be used to help protect the underlying layers (e.g., the third bulk dielectric material 91) from subsequent etching processes. As such, in particular embodiments the third outer shell 93 may be a dielectric material such as silicon nitride deposited using a deposition process such as atomic layer deposition, chemical vapor deposition, physical vapor deposition, combinations of these, or the like. Additionally, third bulk dielectric material 91 may be formed to a thickness of between about 1.5 nm and about 4.0 nm. However, any suitable dielectric material and thickness may be utilized.

By depositing the third outer shell 93 and the third bulk dielectric material 91, the CESL 97 can be deposited with materials which allow the CESL 97 to have both an etch resistant portion (e.g., the third outer shell 93) and also have a dielectric reducing portion (e.g., the third bulk dielectric material 91). Additionally, the CESL 97 can have a gradient region caused by the cycling during the deposition process between about 0.5 nm and about 2.0 nm.

By forming the first seal 73, the second seal 75, and the CESL 97, a multi-layer spacer 95 which includes the first seal 73, the second seal 75, and the CESL 97 can be formed to a thickness of between about 4.5 nm and about 8.0 nm. Additionally, the multi-layer spacer 95 provides enhanced etch resistance (especially to etchants such as plasma $O_2$ ash, sulfuric acid, hydrogen peroxide, dilute hydrofluoric acid, and phosphoric acid) while still maintaining a suitable dielectric constant and having a large spacer conformity (e.g., an inner spacer conformity of <=95% on aspect ratios of greater than 20). In some embodiments the overall dielectric constant of the spacer may be between about 4.2 and about 5.5. Additionally, by forming the layers in-situ with each other as described above, no interlayer oxide film is formed between the different films. By forming the layers as described, an overall Ceff (RO%) can be increased between about 1% and about 2%.

Figure 13B:
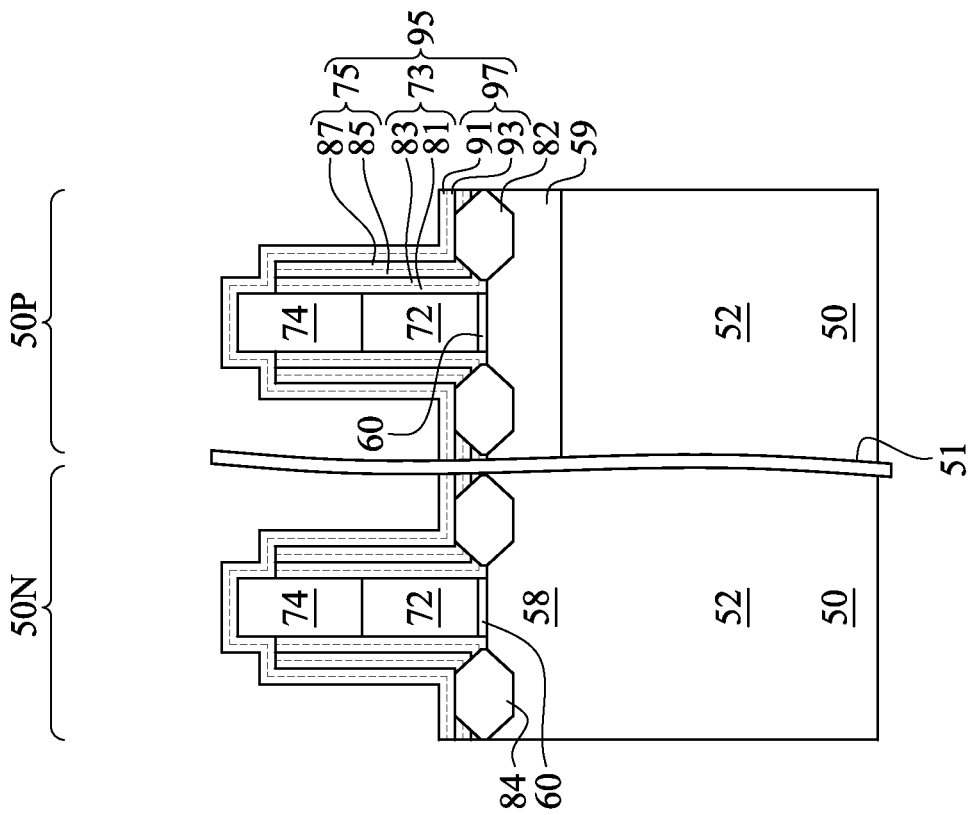
Figure 13A:
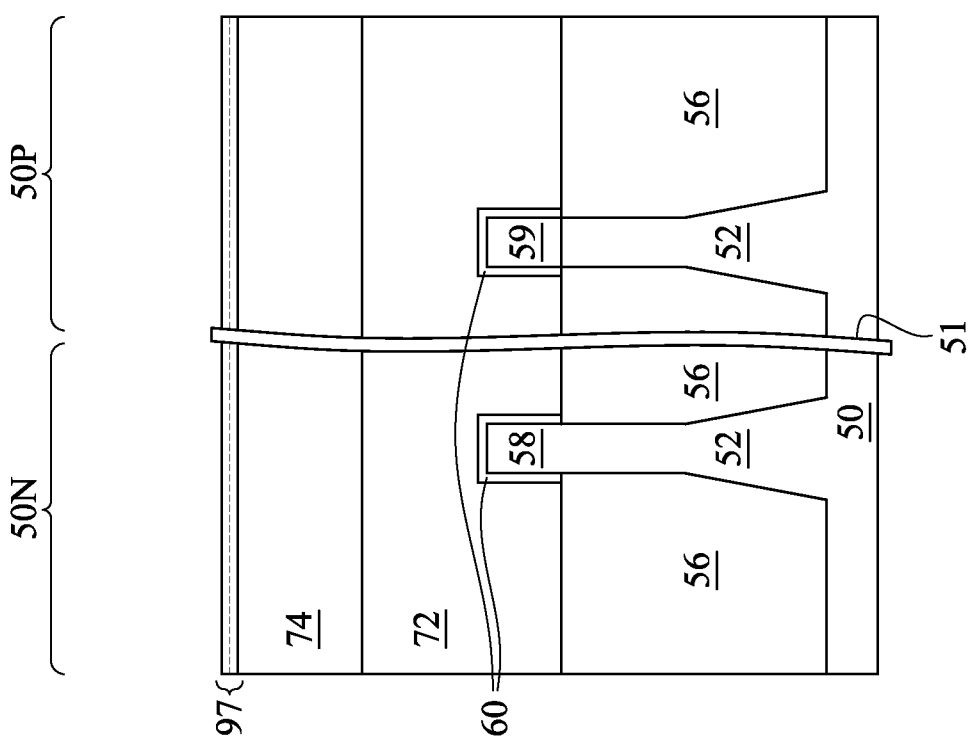
Figure 13D:
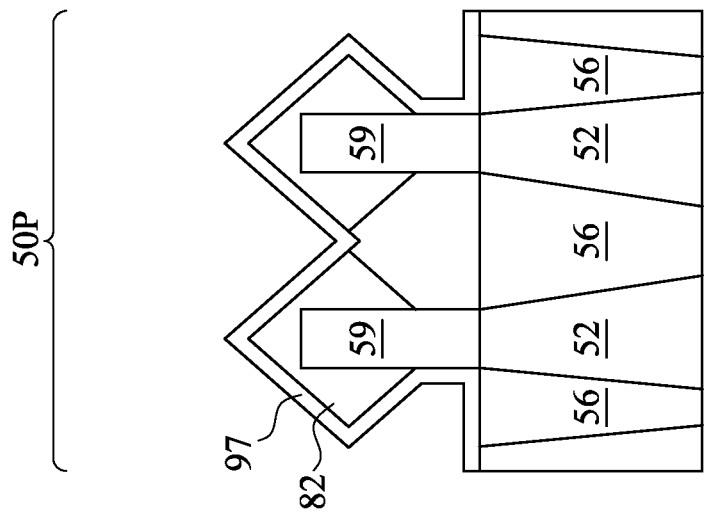
Figure 13C:
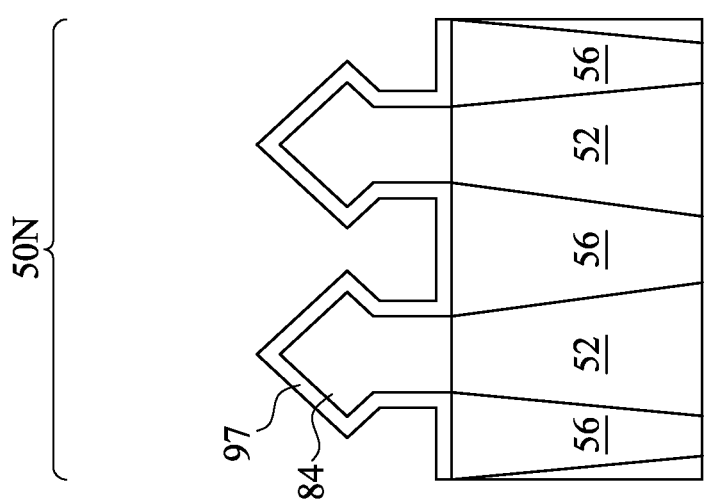
Figure 14B:
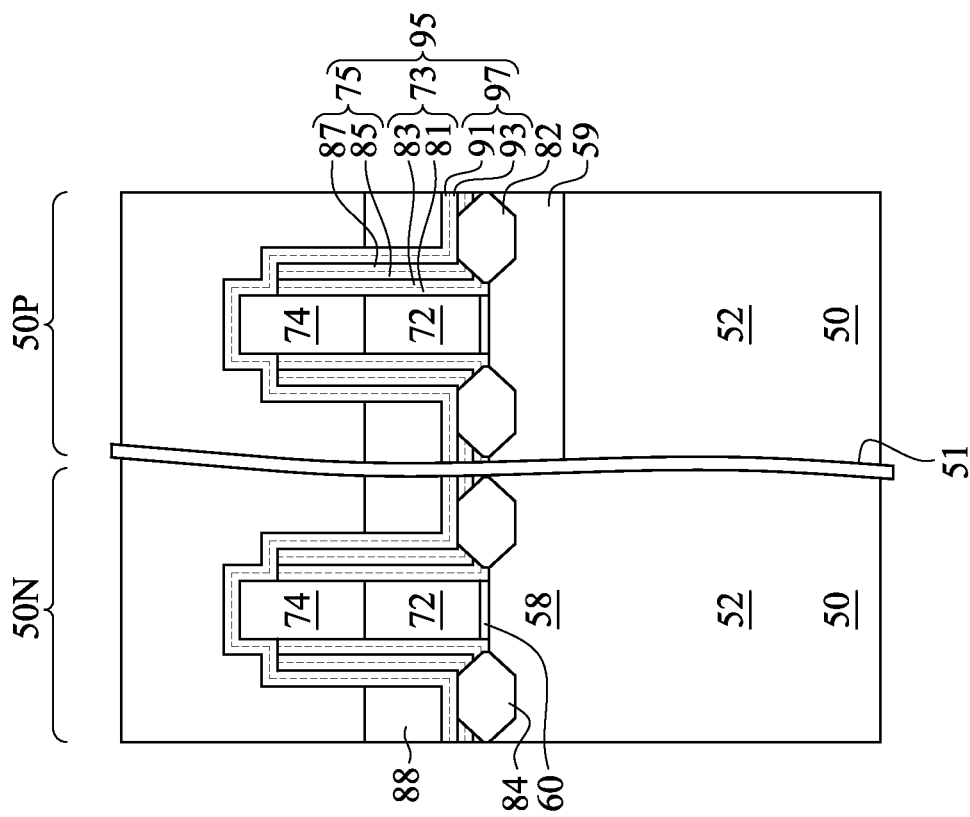
Figure 14A:
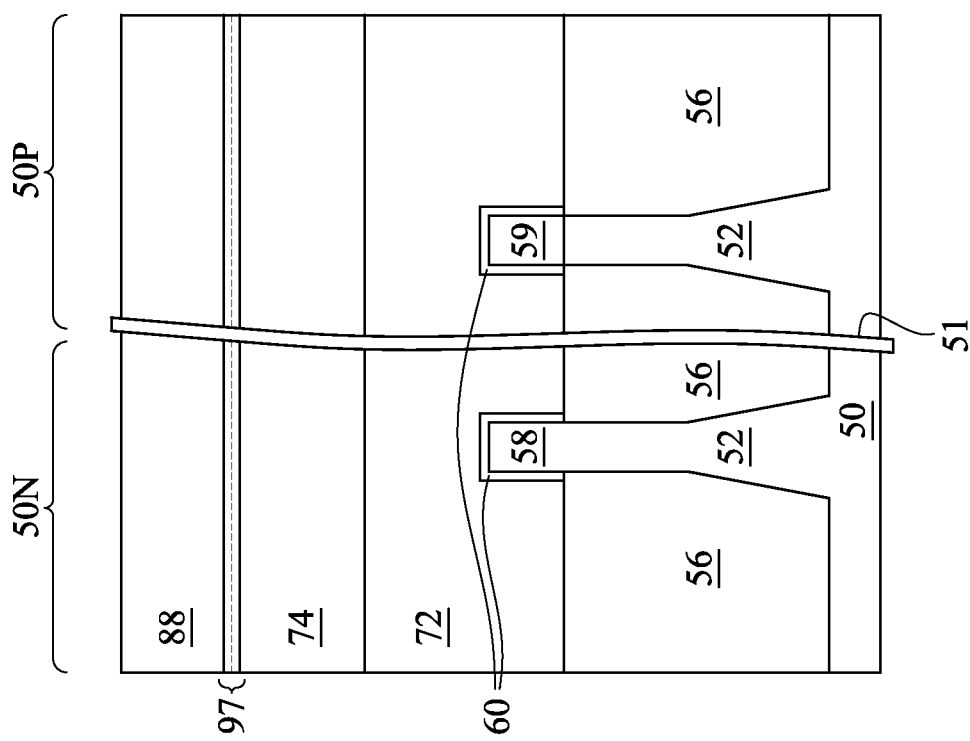

In FIGS. 14A and 14B, a first interlayer dielectric (ILD) 88 is deposited over the structure illustrated in FIGS. 13A and 13B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Once the first ILD 88 has been deposited, an annealing process may be utilized to densify the material of the first ILD 88. In an embodiment the annealing process may be a wet anneal in which the first ILD 88 is heated in a moisture containing environment at a temperature of between about 400 and about 600° C. for a time of between about 0.5 hours and about 3 hours and then dried at a temperature of between about 500° C. and about 700° C. for a time of between about 0.5 hours and about 3 hours. However, any suitable time and temperatures may be utilized.

Figure 15B:
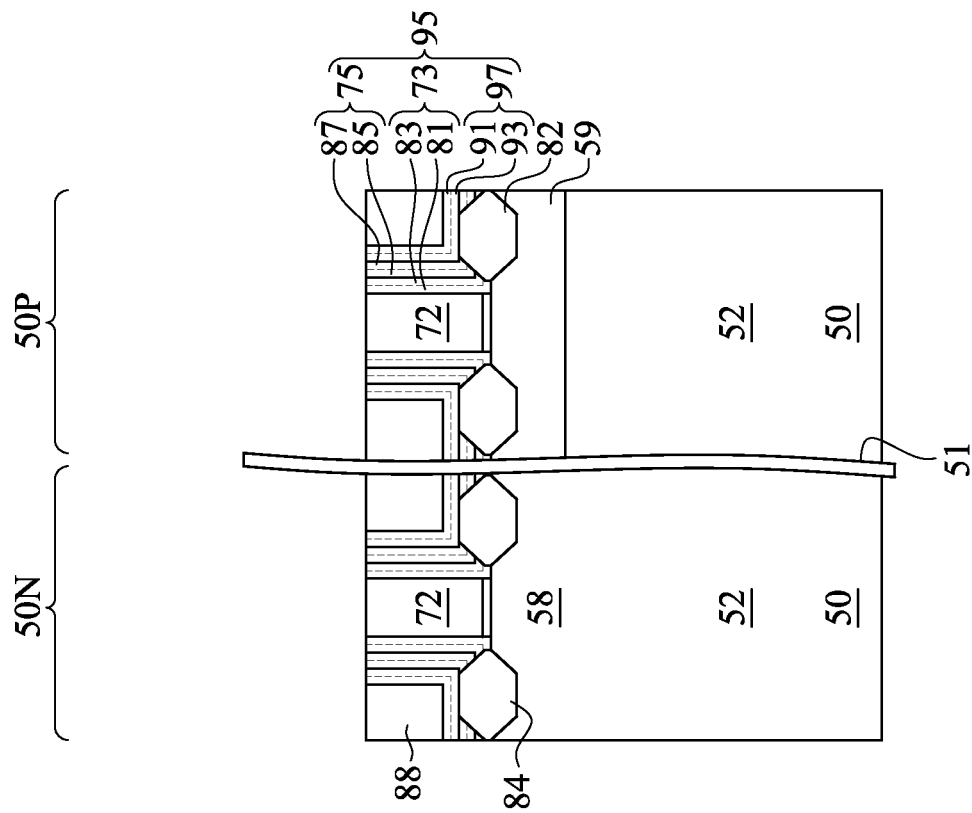
Figure 15A:
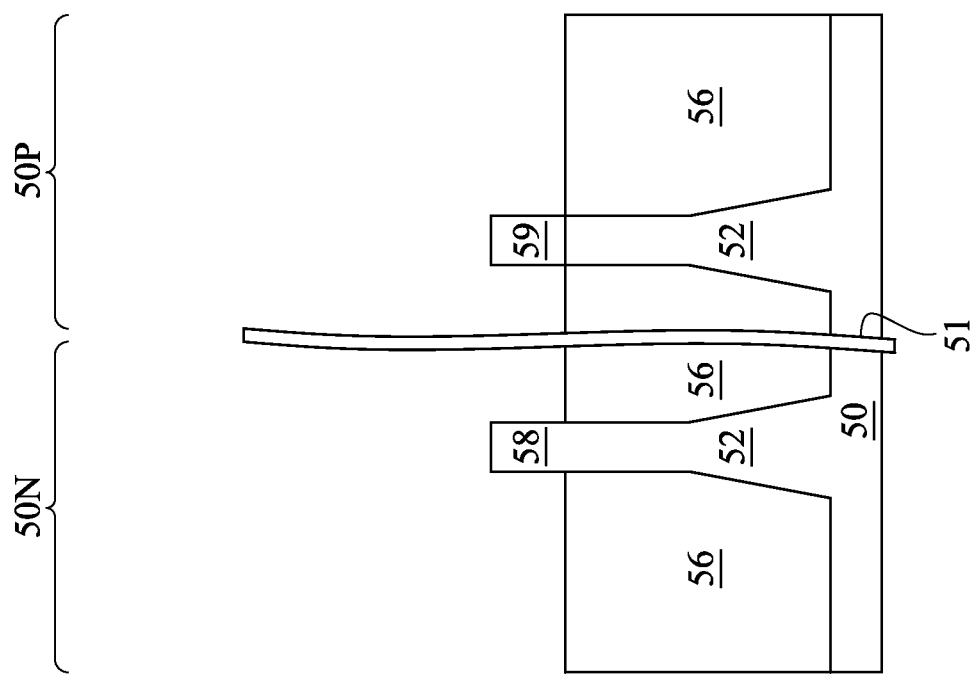

In FIGS. 15A and 15B, a planarization process, such as a CMP, may be performed to level the top surface of the first ILD 88 with the top surfaces of the dummy gates 72 or the masks 74. The planarization process may also remove the masks 74 on the dummy gates 72, and portions of the first seal 73, the second seal 75, and the CESL 97 along sidewalls of the masks 74. After the planarization process, top surfaces of the dummy gates 72, the first seal 73, the second seal 75, the CESL 97, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 16B:
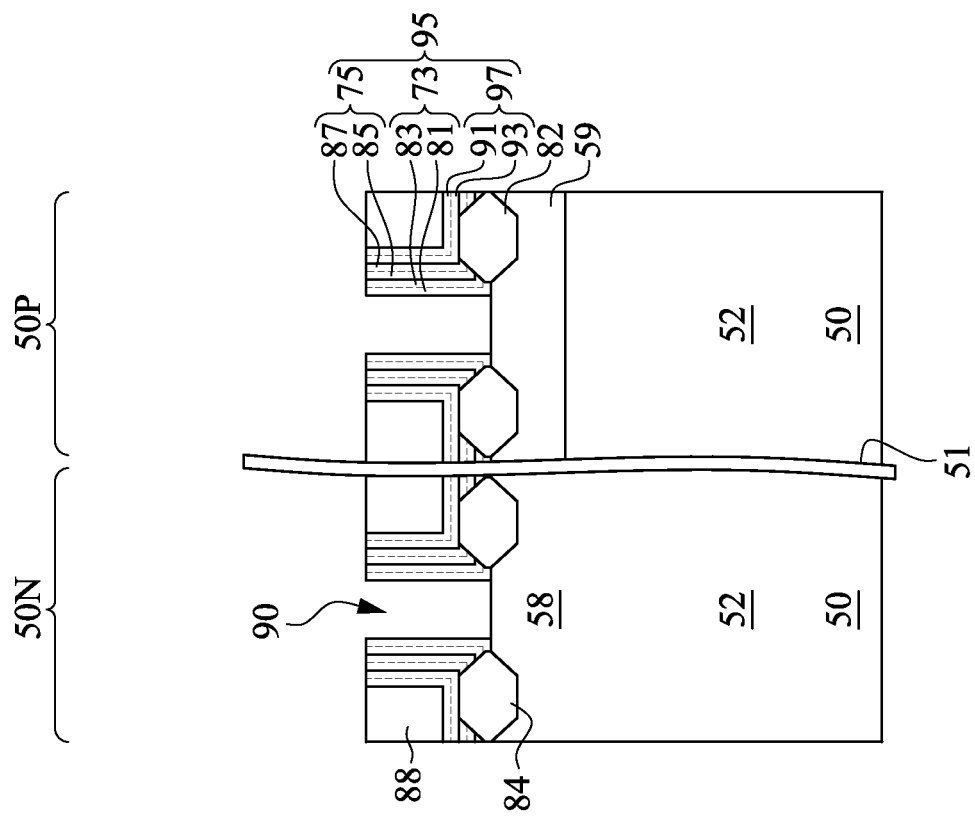
Figure 16A:
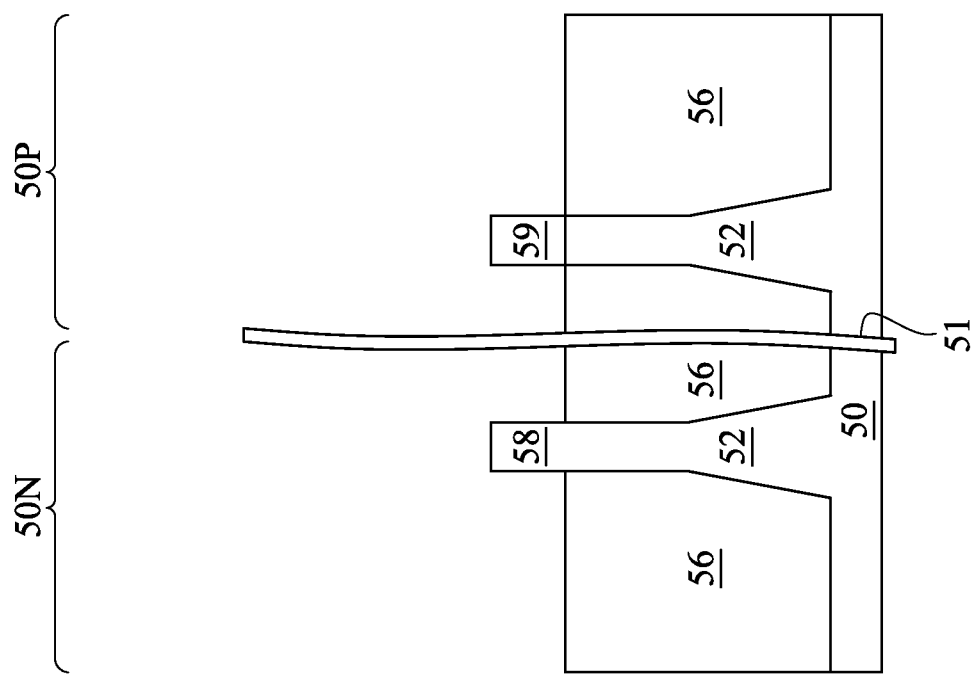

In FIGS. 16A and 16B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) such as ammonia ($NH_3$) and hydrofluoric acid (HF) that selectively etch the dummy gates 72 with little or no etching of the first ILD 88 or the multi-layer spacer 95. Each recess 90 exposes and/or overlies a channel region 58 of a respective fin 52. Each channel region 58 is disposed between neighboring pairs of the epitaxial source/drain regions 82 or the epitaxial source/drain regions 84. During the removal, the dummy dielectric layer 60 may be used as an etch stop layer when the dummy gates 72 are etched. The dummy dielectric layer 60 may then be optionally removed after the removal of the dummy gates 72.

However, as the recess 90 is being formed, the presence of the etch resistant first outer shell 81 helps to reduce damage to the remainder of the multi-layer spacer 95. For example, the first outer shell 81 may lose less than 14 Å of material during the removal of the dummy dielectric layer 60 (while other materials may lose more than 14 Å) while still protecting the material of the first bulk dielectric material 83 (which may lose up to 40 Å). Such protection of the multi-layer spacer 95 has the added benefit of also minimizing losses to the LDD region, which will only see a loss of 9 Å or less.

Figure 17B:
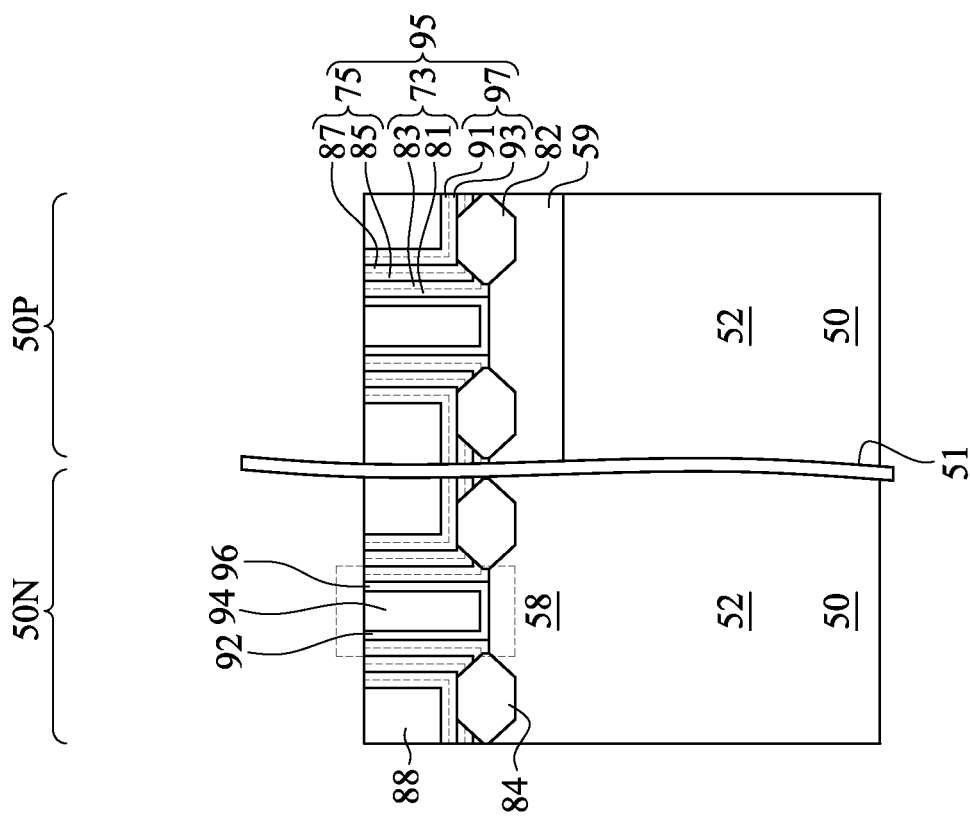
Figure 17A:
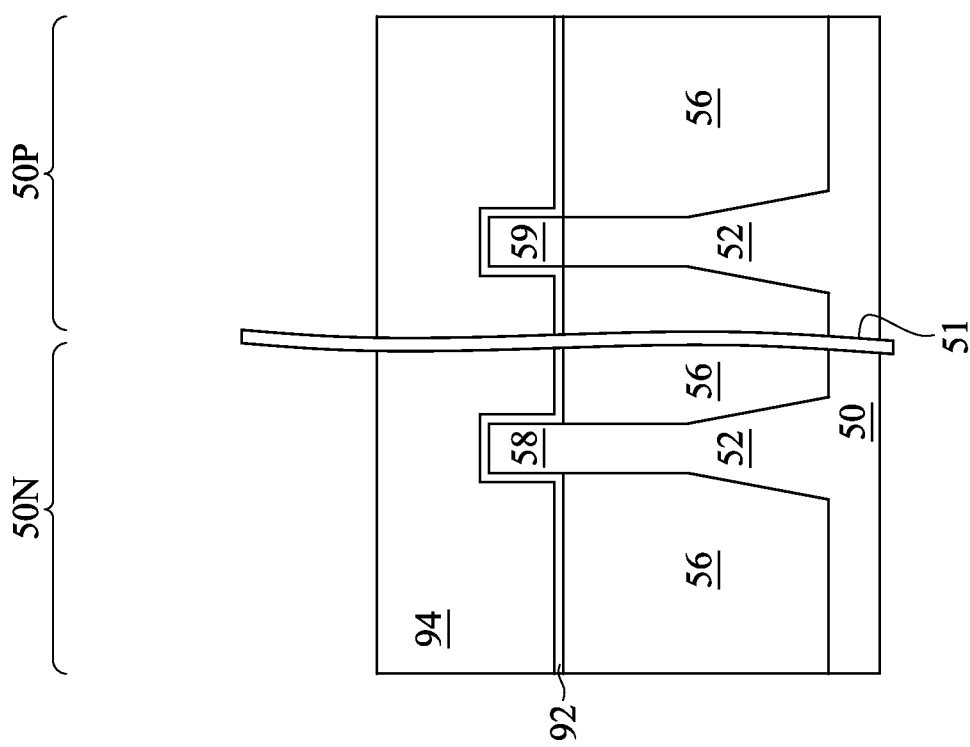
Figure 17C:
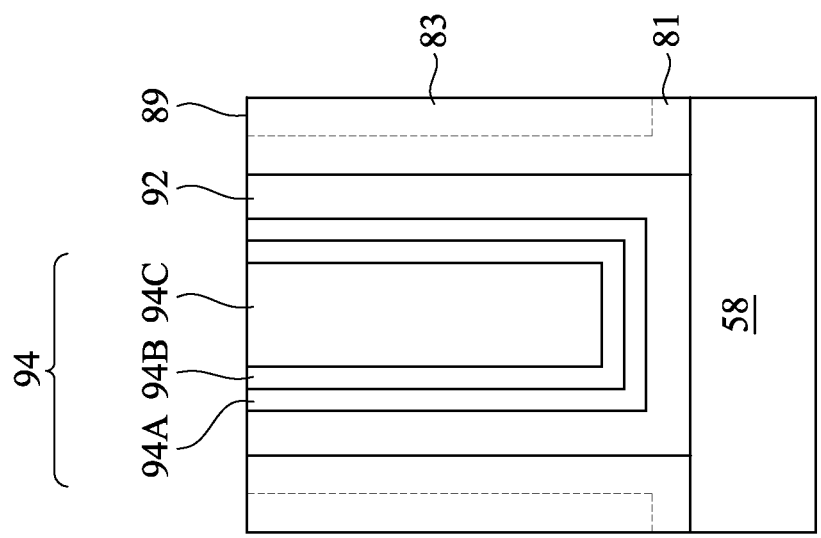

In FIGS. 17A and 17B, gate dielectric layers 92 and gate electrodes 94 are formed for replacement gates. FIG. 17C illustrates a detailed view of region 89 of FIG. 17B. One or more layers of gate dielectric layers 92 deposited in the recesses 90, such as on the top surfaces and the sidewalls of the fins 52 and on sidewalls of the multi-layer spacer 95. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack" and the gate stack may have a gate height of between about 10 nm and about 20 nm and the gate electrode 94 may have a gate length $L_g$ of between about 14.5 nm and about 17 nm. The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
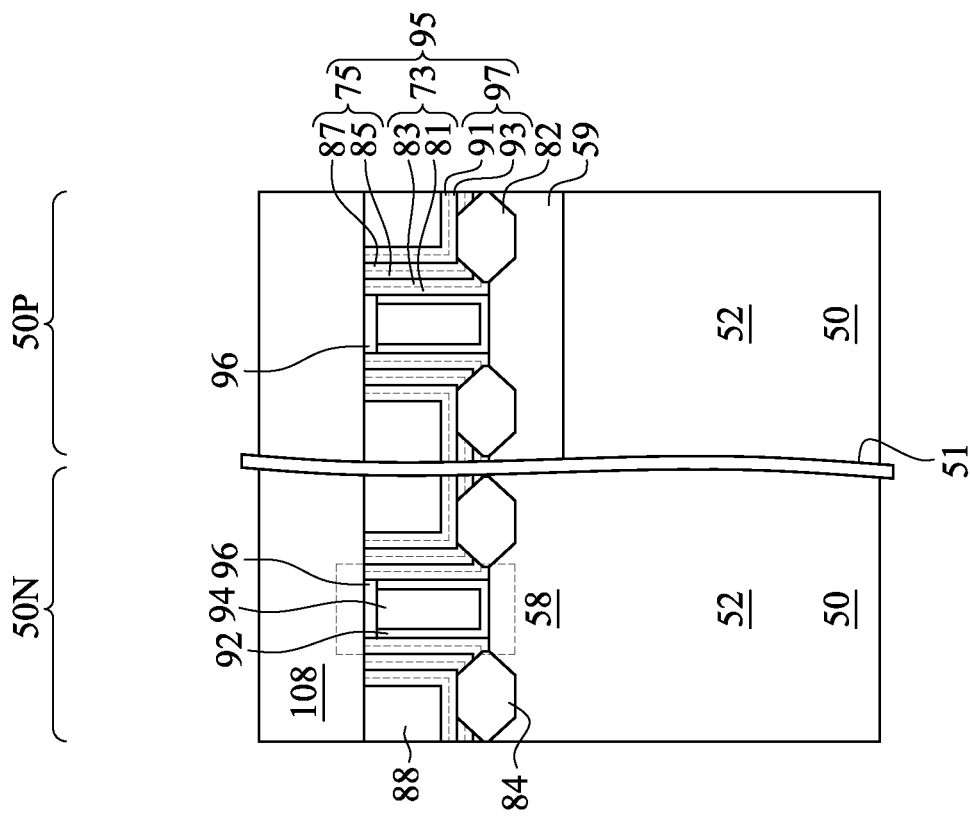
Figure 18A:
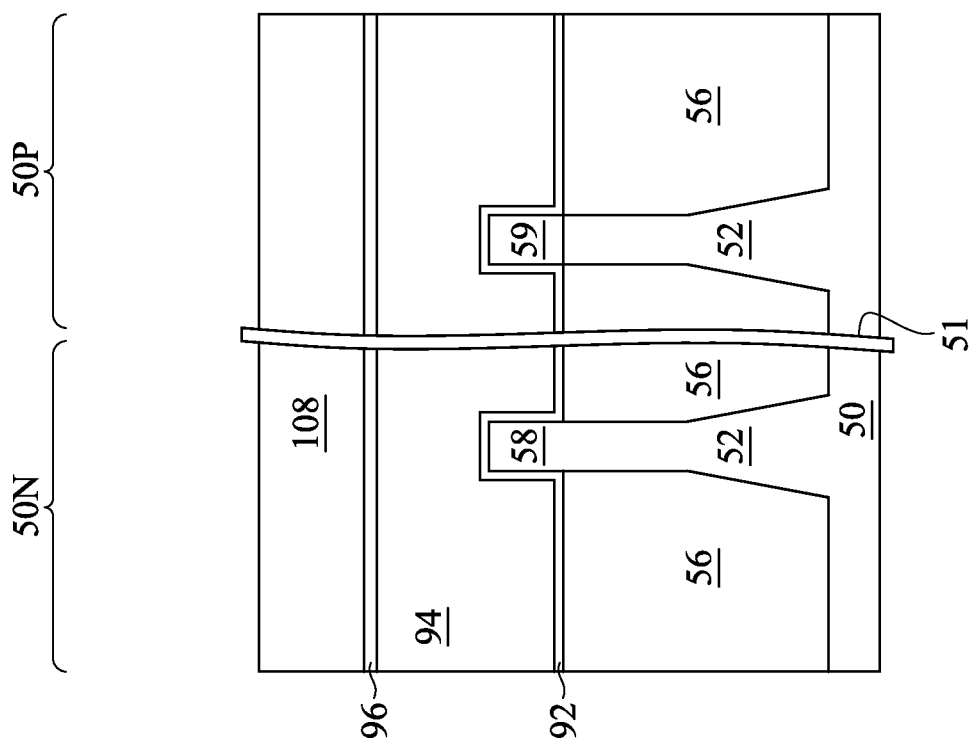

In FIGS. 18A and 18B, a gate mask 96 is formed over the gate stack (including a gate dielectric layer 92 and a corresponding gate electrode 94), and the gate mask may be disposed between opposing portions of the multi-layer spacer 95. In some embodiments, forming the gate mask 96 includes recessing the gate stack so that a recess is formed directly over the gate stack and between opposing portions of multi-layer spacer 95. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 18A and 18B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 19A and 19B) penetrate through the second ILD 108 and the gate mask 96 to contact the top surface of the recessed gate electrode 94.

Figure 19B:
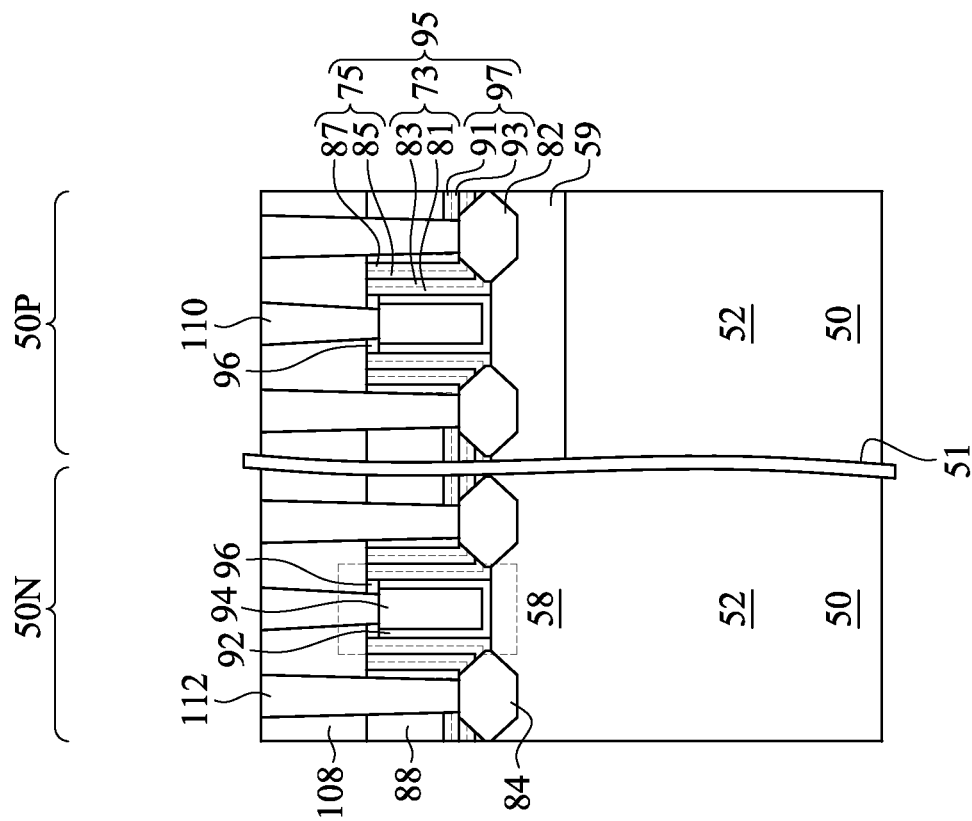
Figure 19A:
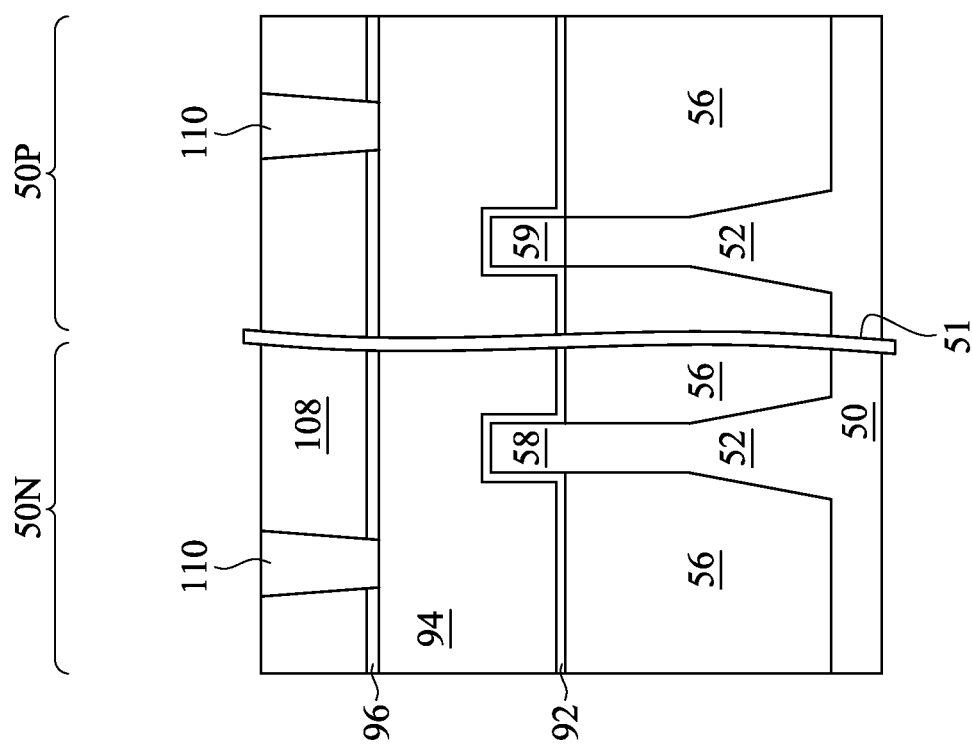

In FIGS. 19A and 19B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the epitaxial source/drain regions 84 and the source/drain contacts 112. The source/drain contacts 112 are physically and electrically coupled to the epitaxial source/drain regions 82 and the epitaxial source/drain regions 84, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

By forming the multi-layer spacer 95 as described herein, benefits may be obtained. In particular, by using multiple layers with each layer comprising both a shell portion and a bulk portion, the etching resistance may be increased without unduly increasing the overall dielectric constant. As such, less damage will occur, and the overall performance of the device may be increased.

In an embodiment, a semiconductor device includes: a first spacer layer comprising an inner layer disposed between two outer layers, wherein the inner layer and the two outer layers each comprise a first material, wherein a carbon content of the two outer layers is greater than that of the inner layer, and an oxygen content of the two outer layers is less than that of the inner layer; and a second spacer layer comprising a first layer and a second layer, the first layer being the first material and being in direct contact with one of the two outer layers. In an embodiment, the first material comprises SiOCN. In an embodiment, the second layer comprises silicon nitride. In an embodiment, the carbon content of the first layer of the second spacer layer is less than about 2%. In an embodiment, one of the two outer layers has a density of between about 2.5 $g/cm^3$ and about 2.7 $g/cm^3$. In an embodiment, the inner layer has a nitrogen concentration of between about 5% and about 12%. In an embodiment, one of the two outer layers has a nitrogen concentration of between about 25% and about 45%.

In another embodiment, a semiconductor device includes: a first seal adjacent to a gate stack, the first seal comprising: a first shell of a first material with a first composition; and a first bulk material of the first material with a second composition different from the first composition; a second seal in physical contact with the first seal, the second seal comprising: a second shell of the first material with a third composition; and a second bulk material of the first material with a fourth composition different from the third composition; and a contact etch stop layer in physical contact with the second seal, the contact etch stop layer comprising: a third bulk material of the first material with a fifth composition; and a third shell of a second material different from the first material. In an embodiment the first material comprises silicon carbon oxynitride. In an embodiment the first composition has a smaller oxygen concentration than the second composition. In an embodiment the first composition has a larger nitrogen concentration than the second composition. In an embodiment the first composition has a larger carbon concentration than the second composition. In an embodiment the second material comprises silicon nitride. In an embodiment the first composition has a carbon concentration of between about 5% and about 20%.

In yet another embodiment, a method of manufacturing a semiconductor device includes: patterning a dummy gate electrode over a semiconductor fin; sequentially introducing a first set of precursors to the dummy gate electrode using a first set of exposure times to form a first shell layer; sequentially introducing the first set of precursors to the dummy gate electrode using a second set of exposure times different from the first set of exposure times to form a first bulk dielectric material; sequentially introducing the first set of precursors to the dummy gate electrode using a third set of exposure times to form a second bulk dielectric material; sequentially introducing the first set of precursors to the dummy gate electrode using a fourth set of exposure times different from the first set of exposure times to form a second shell layer; sequentially introducing the first set of precursors to the dummy gate electrode using a fifth set of exposure times to form a third bulk dielectric material; and depositing a dielectric material after the sequentially introducing the first set of precursors to the dummy gate electrode using the fifth set of exposure times. In an embodiment the first shell layer is silicon carbon oxynitride. In an embodiment the dielectric material is silicon nitride. In an embodiment the sequentially introducing the first set of precursors to the dummy gate electrode using the third set of exposure times occurs after a formation of a lightly doped source/drain region. In an embodiment the sequentially introducing the first set of precursors to the dummy gate electrode using the third set of exposure times occurs prior to a formation of a lightly doped source/drain region. In an embodiment the first shell layer has a higher concentration of nitrogen than the first bulk dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first spacer layer comprising an inner layer disposed between two outer layers, wherein the inner layer and the two outer layers each comprise a first material, wherein a carbon content of the two outer layers is greater than that of the inner layer, and an oxygen content of the two outer layers is less than that of the inner layer; and
a second spacer layer comprising a first layer and a second layer, the first layer being the first material and being in direct contact with one of the two outer layers.

2. The semiconductor device of claim 1, wherein the first material comprises SiOCN.

3. The semiconductor device of claim 1, wherein the second layer comprises silicon nitride.

4. The semiconductor device of claim 1, wherein the carbon content of the first layer of the second spacer layer is less than about 2%.

5. The semiconductor device of claim 1, wherein one of the two outer layers has a density of between about 2.5 $g/cm^3$ and about 2.7 $g/cm^3$.

6. The semiconductor device of claim 1, wherein the inner layer has a nitrogen concentration of between about 5% and about 12%.

7. The semiconductor device of claim 1, wherein one of the two outer layers has a nitrogen concentration of between about 25% and about 45%.

8. A semiconductor device comprising:
a first seal adjacent to a gate stack, the first seal comprising:
a first shell of a first material with a first composition; and
a first bulk material of the first material with a second composition different from the first composition;
a second seal in physical contact with the first seal, the second seal comprising:
a second shell of the first material with a third composition; and
a second bulk material of the first material with a fourth composition different from the third composition; and
a contact etch stop layer in physical contact with the second seal, the contact etch stop layer comprising:
a third bulk material of the first material with a fifth composition; and
a third shell of a second material different from the first material.

9. The semiconductor device of claim 8, wherein the first material comprises silicon carbon oxynitride.

10. The semiconductor device of claim 8, wherein the first composition has a smaller oxygen concentration than the second composition.

11. The semiconductor device of claim 10, wherein the first composition has a larger nitrogen concentration than the second composition.

12. The semiconductor device of claim ii, wherein the first composition has a larger carbon concentration than the second composition.

13. The semiconductor device of claim 12, wherein the second material comprises silicon nitride.

14. The semiconductor device of claim 8, wherein the first composition has a carbon concentration of between about 5% and about 20%.

15. A semiconductor device comprising:
a first shell layer with a first set of elements;
a first bulk dielectric material with the first set of elements adjacent to the first shell layer, the first bulk dielectric material having a different composition than the first shell layer;
a second bulk dielectric material adjacent to the first bulk dielectric material, the second bulk dielectric material having the first set of elements;
a second shell layer with the first set of elements adjacent to the second bulk dielectric material, the second shell layer having a different composition than the second bulk dielectric material;
a third bulk dielectric material with the first set of elements adjacent to the second shell layer; and
a dielectric material adjacent to the third bulk dielectric material.

16. The semiconductor device of claim 15, wherein the first shell layer is silicon carbon oxynitride.

17. The semiconductor device of claim 16, wherein the dielectric material is silicon nitride.

18. The semiconductor device of claim 15, herein the first shell layer has a lower concentration of oxygen than the first bulk dielectric material.

19. The semiconductor device of claim 15, wherein the first shell layer has a higher concentration of nitrogen than the first bulk dielectric material.

20. The semiconductor device of claim 15, wherein the first bulk dielectric material has a nitrogen concentration of between about 5% and about 12%.

\* \* \* \* \*

UNITED STATES PATENT AND TRADEMARK OFFICE
CERTIFICATE OF CORRECTION

PATENT NO. : 11,682,711 B2
APPLICATION NO. : 17/145925
DATED : June 20, 2023
INVENTOR(S) : Lin et al.

Page 1 of 1

It is certified that error appears in the above-identified patent and that said Letters Patent is hereby corrected as shown below:

In the Claims

In Column 18, in Claim 12, Line 60, delete "claim ii," and insert -- claim 11, --, therefor.

In Column 19, in Claim 18, Line 22, delete "herein" and insert -- wherein --, therefor.

Signed and Sealed this
Nineteenth Day of September, 2023

Katherine Kelly Vidal
*Director of the United States Patent and Trademark Office*